US011160162B1

(12) United States Patent
Xing et al.

(10) Patent No.: US 11,160,162 B1
(45) Date of Patent: Oct. 26, 2021

(54) VIA-LESS PATTERNED GROUND STRUCTURE COMMON-MODE FILTER

(71) Applicant: Western Digital Technologies, Inc., San Jose, CA (US)

(72) Inventors: Xinzhi Xing, San Jose, CA (US); Antonio Ciccomancini Scogna, Cupertino, CA (US); Jack Nguyen, San Jose, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 16/946,615

(22) Filed: Jun. 29, 2020

(51) Int. Cl.
*H05K 1/02* (2006.01)
*H03H 7/42* (2006.01)
*H05K 1/11* (2006.01)

(52) U.S. Cl.
CPC ........... *H05K 1/0218* (2013.01); *H03H 7/427* (2013.01); *H05K 1/115* (2013.01)

(58) Field of Classification Search
CPC ................. H05K 1/0218; H05K 1/111; H05K 2201/0707; H05K 1/0715; H05K 2201/0723; H03H 7/427; H02J 3/01; H02M 1/126
See application file for complete search history.

(56) References Cited

U.S. PATENT DOCUMENTS 5,801,597 A  9/1998 Carter et al.
6,088,235 A  7/2000 Chiao et al.
6,956,444 B2  10/2005 Miller
7,109,817 B2  9/2006 Kolb et al.
(Continued)

FOREIGN PATENT DOCUMENTS

CN  106255307 A  12/2016
JP  H02181961 A  7/1990
(Continued)

OTHER PUBLICATIONS

Z. Zeng, S. J. Chen and C. Fumeaux, "A Reconfigurable Filter Using Defected Ground Structure for Wideband Common-Mode Suppression," in IEEE Access, vol. 7, p. 36980-36990, Mar. 2019, doi: 10.1109/ACCESS.2019.2906340.
(Continued)

*Primary Examiner* — Hoa C Nguyen
(74) *Attorney, Agent, or Firm* — Jacobsen IP Law; Krista S. Jacobsen

(57) ABSTRACT

Disclosed herein are multi-layer metal circuits, such as printed circuit boards (PCBs), with single-sided, partially-shielded, or fully-shielded via-less common-mode filters. The multi-layer metal circuits comprise at least one shield layer, at least one signal trace, and at least one reference layer (e.g., ground). The reference layer comprises a pattern of the via-less common-mode filter. The pattern may comprise, for example, a single piece-wise linear segment, or two or more disjoint and non-intersecting segments (which may be strictly linear or piece-wise linear). The reference layer is electrically isolated from the shield layer, and thus the via-less common-mode filters do not require vias. In addition to being used in PCBs, the disclosed multi-layer metal circuits may also be used in other applications, such as integrated circuits (e.g., implemented in semiconductor chips).

22 Claims, 19 Drawing Sheets

(56) References Cited

U.S. PATENT DOCUMENTS

| | | | |
|---|---|---|---|
| 7,130,434 | B1 | 10/2006 | Grattan et al. |
| 7,271,978 | B1 | 9/2007 | Santini et al. |
| 7,330,325 | B2 | 2/2008 | Vacar et al. |
| 7,529,103 | B2 | 5/2009 | Chen et al. |
| 7,535,321 | B1 | 5/2009 | Degerstrom et al. |
| 7,656,601 | B1 | 2/2010 | Li |
| 7,657,564 | B2 | 2/2010 | Hsu et al. |
| 7,825,750 | B2 | 11/2010 | Lee et al. |
| 7,932,793 | B2 | 4/2011 | Wu et al. |
| 8,125,727 | B2 | 2/2012 | Tsuwako et al. |
| 8,126,402 | B1 | 2/2012 | Jatou et al. |
| 8,164,006 | B2 | 4/2012 | Kim et al. |
| 8,339,212 | B2 | 12/2012 | Wu et al. |
| 8,659,365 | B2 | 2/2014 | Wu et al. |
| 8,680,403 | B2 * | 3/2014 | Howard .............. H05K 1/0253 174/261 |
| 8,848,385 | B2 | 9/2014 | Warwick et al. |
| 8,907,748 | B2 | 12/2014 | Pajovic |
| 9,030,287 | B2 | 5/2015 | Motomiya et al. |
| 9,059,491 | B2 | 6/2015 | Lim et al. |
| 9,245,681 | B2 | 1/2016 | Kato et al. |
| 9,264,010 | B2 | 2/2016 | Lee et al. |
| 9,485,869 | B2 | 11/2016 | Schuster |
| 9,525,441 | B2 | 12/2016 | Chen et al. |
| 9,717,140 | B2 | 7/2017 | Contreras et al. |
| 9,786,331 | B1 * | 10/2017 | Wallash .............. H05K 1/0225 |
| 9,881,650 | B1 | 1/2018 | Sotome et al. |
| 9,907,160 | B2 * | 2/2018 | Lin .................. H01P 3/026 |
| 10,244,618 | B2 | 3/2019 | Wallash et al. |
| 10,285,259 | B2 | 5/2019 | Wallash et al. |
| 10,411,670 | B2 | 9/2019 | Xing et al. |
| 10,491,184 | B1 | 11/2019 | Yan |
| 10,499,489 | B2 * | 12/2019 | Bois ................... H05K 1/0218 |
| 10,499,490 | B2 | 12/2019 | Lee |
| 10,681,842 | B1 * | 6/2020 | Hart .................. H05K 1/0201 |
| 2005/0103522 | A1 | 5/2005 | Grundy et al. |
| 2006/0081397 | A1 | 4/2006 | Enchi et al. |
| 2007/0069834 | A1 * | 3/2007 | Ikuta ................... H05K 1/111 333/133 |
| 2010/0073109 | A1 | 3/2010 | Wu et al. |
| 2010/0109816 | A1 * | 5/2010 | Tzuang ............... H01P 3/082 333/238 |
| 2010/0321135 | A1 | 12/2010 | Kushta |
| 2011/0273245 | A1 | 11/2011 | Pai et al. |
| 2011/0298563 | A1 | 12/2011 | Pai et al. |
| 2011/0309898 | A1 * | 12/2011 | Pai ..................... H01P 3/026 333/204 |
| 2012/0194290 | A1 | 8/2012 | Wu et al. |
| 2013/0271909 | A1 | 10/2013 | Chen et al. |
| 2014/0049343 | A1 * | 2/2014 | Sakai ................. H01P 7/082 333/219 |
| 2014/0218132 | A1 | 8/2014 | Chen |
| 2016/0087323 | A1 | 3/2016 | Wu et al. |
| 2016/0142031 | A1 | 5/2016 | Ueki et al. |
| 2017/0127509 | A1 | 5/2017 | Contreras et al. |
| 2017/0295644 | A1 * | 10/2017 | Wallash ............. H01P 1/203 |
| 2018/0233796 | A1 * | 8/2018 | Zhang .............. H01P 1/212 |

FOREIGN PATENT DOCUMENTS

| | | |
|---|---|---|
| JP | H08293416 A | 11/1996 |
| TW | M385809 | 8/2010 |
| WO | 2014045792 A1 | 3/2014 |

OTHER PUBLICATIONS

Boutejdar, A., et al., "New Low-Pass Filter Design Using Compensated Microstrip Capacitor and Coupled Meander Defected Ground Structure (DGS)," 2009 German Microwave Conference, Mar. 16, 2009.

Fangxu Yang, et al., "An Ultra-Wideband Common-Mode Noise Filter for Differential Signals Using Compact Patterned Ground Structure," IEEE MTT-S International Microwave Symposium (IMS), May 2016.

Gao, Si-Ping et al., "Common-Mode Filter using Cavity-Backed Defected Ground Structure for Multilayer PCB," 2016 Asia-Pacific International Symposium on Electromagnetic Compatibility (APEMC), Shenzhen, 2016, pp. 916-918.

Hailing Yue, et al., "Modified Spiral Shaped Defected Ground Structure with Spurious Free Band Rejection Performance," 2016 IEEE 17th Annual Wireless and Microwave Technology Conference (WAMICON), Apr. 2016.

Ho Seong Lee et al., "A Compact Common-Mode Suppression Filter Using Modified Ground Structure for High Speed Digital Interconnects on Multi-layered PCB," Proc. of the 2014 International Symposium on Electromagnetic Compatibility (EMC Europe 2014), Gothenburg, Sweden, Sep. 1-4, 2014.

International Search Report and Written Opinion in PCT Application No. PCT/US2018/022519 (filed Mar. 14, 2018), dated Jul. 4, 2018.

International Search Report and Written Opinion in PCT Application No. PCT/US2018/022800 (filed Mar. 16, 2018), dated Jun. 29, 2018.

International Search Report and Written Opinion in PCT Application No. PCT/US2018/022813 (filed Mar. 16, 2018), dated Jun. 26, 2018.

Liu, Qian et al., "Common-Mode Filters With Interdigital Fingers for Harmonics Suppression and Lossy Materials for Broadband Suppression," IEEE Transactions on Electromagnetic Compatibility, vol. 57, Issue 6, Dec. 2015.

M. S. Razalli et al., "Novel compact 'via-less, ultra-wide band filter utilizing capacitive microstrip patch," Progress In Electromagnetics Research, Pier 91, 213-227, 2009.

N. Suresh Kumar et al., "Suppression of common-mode radiation from high speed printed circuit board using modified ground patterns," International Journal of Information Sciences and Techniques (IJIST) vol. 4, No. 3, May 2014.

Panasonic, "Common mode Noise Filter Array Type: EXC28CG," Nov. 2, 2012.

Shu-Jung Wu et al., "A novel HU-shaped common-mode filter for GHz differential signals," 2008 IEEE International Symposium on Electromagnetic Compatibility, Aug. 18, 2008.

Shu-Jung Wu, et al., "A Novel Wideband Common-Mode Suppression Filter for Gigahertz Differential Signals Using Coupled Patterned Ground Structure," IEEE Transactions on Microwave Theory and Techniques, vol. 57, No. 4, Apr. 2009.

TEKTRONIX, "Measurement Solutions for Disk Drive Design," Sep. 2006.

Xian-Ke Gao, et al., "A Compact Common-mode Noise Suppression Filter for High Speed Differential Signals Using Defected Ground Structure," 2015 Asia-Pacific Symposium on Electromagnetic Compatibility (APEMC), May 2015.

* cited by examiner

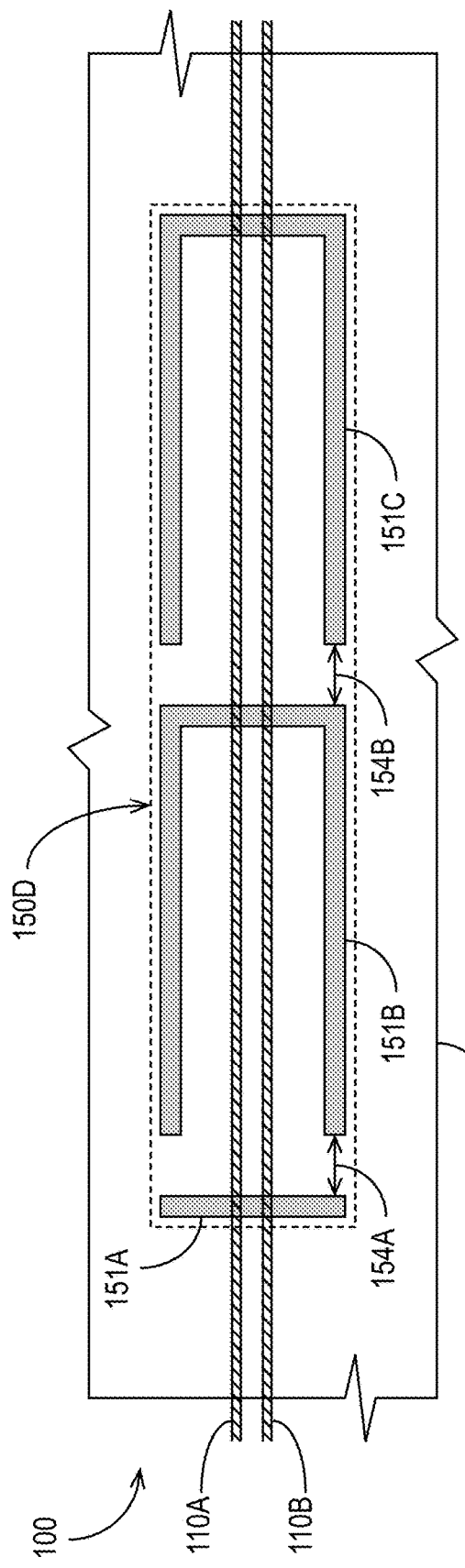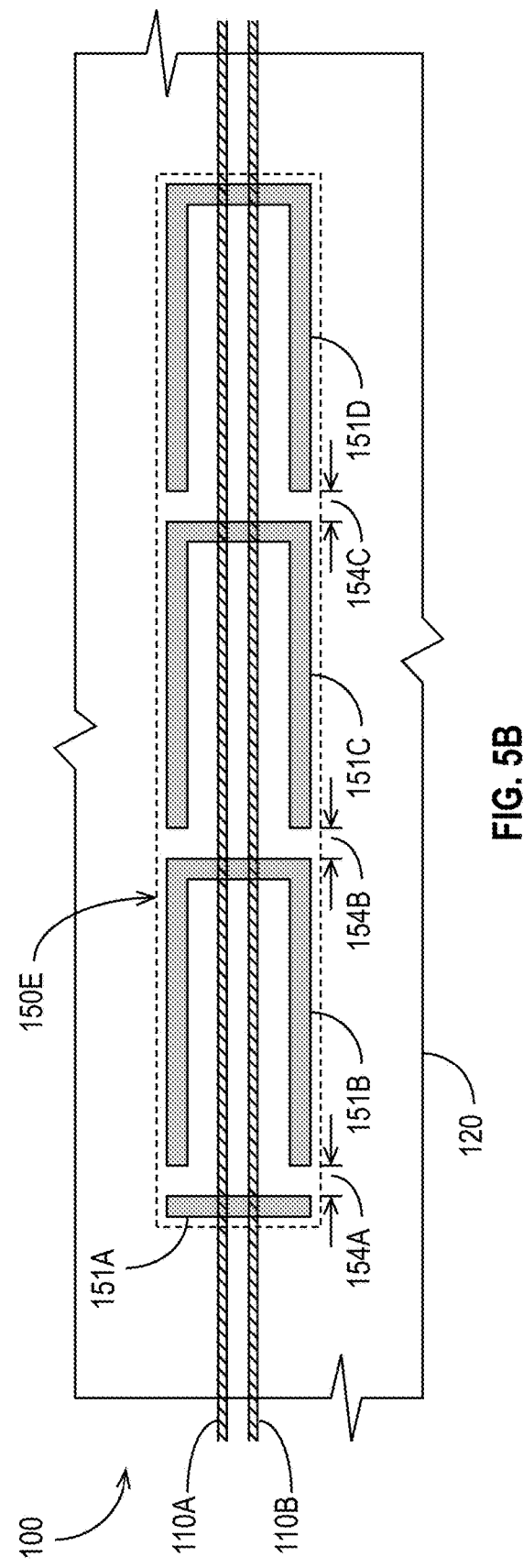

VIA-LESS PATTERNED GROUND STRUCTURE COMMON-MODE FILTER

BACKGROUND

There are many ways to transmit signals over conductors. In single-ended signaling, one conductor carries a signal as a voltage that varies over time. The signal is referenced to a fixed potential, which is usually a 0 V node referred to as ground. Thus, one conductor carries the signal and one conductor carries the reference potential. The receiver extracts information by detecting the difference between the signal-carrying conductor and the reference potential.

In differential signaling (sometimes referred to as double-ended signaling), information is transmitted over two conductors using two complementary voltage signals, one over each conductor. One conductor carries the signal, and the other carries the inverted signal. The pair of conductors can be, for example, traces on a printed circuit board (PCB). The receiver extracts information from the pair of conductors by detecting the difference in potential between the inverted and non-inverted signals. Ideally, the voltage signals on the two conductors have equal amplitude and opposite polarity relative to a common-mode voltage, in which case they are said to be balanced. The return currents associated with these voltages also have equal amplitude and opposite polarity and thus cancel each other out; for this reason, differential signals ideally have zero current flowing through the ground connection.

Relative to single-ended signaling, differential signaling offers a number of advantages for high-speed data transfer. For example, if electromagnetic interference (EMI; also referred to as radio-frequency interference (RFI)) or crosstalk (e.g., EMI generated by nearby signals) is introduced from a source outside the differential conductors, it is added equally to the inverted and non-inverted signals. Because the receiver operates on the difference in voltage between the two signals, the receiver circuitry will greatly reduce the amplitude of any interference or crosstalk that is present in the received signal. Thus, differential signals are less sensitive than single-ended signals to EMI, crosstalk, or any other noise that couples into both signals of the differential pair.

Another advantage of differential signaling is that because differential signals have higher EMI immunity than single-ended signals, differential signals can use lower voltages than single-ended signals and still maintain adequate signal-to-noise ratio (SNR). In addition, the SNR with differential signaling is two times that of an equivalent single-ended implementation because the dynamic range at the differential receiver is twice as high as the dynamic range of each signal within the differential pair.

Several advantages flow from the ability of differential signaling to successfully transfer data using lower signal voltages, including that supply voltage requirements are lower, which reduces power consumption. In addition, smaller voltage transitions, which are possible because of greater immunity to EMI, allow for higher operating frequencies. Consequently, high-speed digital systems often use differential signaling.

Differential signaling also tends to cause less EMI than single-ended signaling. The rising and falling edges of digital signals can generate significant amounts of EMI, and both single-ended and differential signals generate EMI. But because the currents in the conductors in differential signaling travel in opposite directions, the two signals in a differential pair create electromagnetic fields that are opposite in polarity. If the differential signal paths are identical and in close proximity to each other, the individual electromagnetic fields caused by the two signals will largely cancel each other. If, however, the two signal paths are not identical, the generated magnetic fields will not be exactly equal and opposite and will not completely cancel each other. As a result, the common mode current on the two conductors can generate an electromagnetic field outside the pair of conductors, which act like an antenna and radiate EMI. In addition, due to integrated circuit process imperfections, mismatches in the different pair circuit drivers can produce an inherent common-mode signal, which can create EMI.

Although differential signal paths are ideally identical, and the signals carried on the two conductors ideally have equal amplitude and opposite polarity, practical systems using differential signaling typically suffer from intrinsic common-mode noise as well as interference caused by sources outside the differential conductors, and the differential conductors can also radiate EMI and thereby cause interference to external systems or nearby circuits. Collectively, the common-mode noise and interference (whether received or generated) are referred to herein simply as "common-mode noise." Common-mode noise can be caused by clock skew, differences in amplitude between the signals on the two paths, unbalanced routing (e.g., one of the two conductors' paths is longer or shorter than the other, or the distance between conductors varies along their lengths, etc.), and other factors. Above the gigahertz frequency range, common-mode interference signals can degrade differential signal integrity and/or power integrity, and the use of differential signaling may also cause EMI. As a consequence, common-mode noise can degrade the SNR of the transmitted signal and cause detection errors. Likewise, single-ended signaling also suffers from noise and EMI, and can also generate EMI that can adversely affect other receivers.

Therefore, there is an ongoing need for ways to reduce common-mode noise.

SUMMARY

This summary represents non-limiting embodiments of the disclosure.

Disclosed herein are via-less common-mode filters that mitigate the effects of common-mode noise, PCBs and other multi-layer metal circuits comprising such via-less common-mode filters, and data storage devices comprising such PCBs or multi-layer metal circuits. Also disclosed are methods of manufacturing PCBs and other multi-layer metal circuits that have via-less common-mode filters.

In some embodiments, a multi-layer metal circuit, such as a PCB and integrated circuits (e.g., implemented in semiconductor chips), comprises a shield layer, a signal trace layer comprising at least one signal trace, and a ground layer disposed between the shield layer and the signal trace layer, the ground layer comprising a pattern of a via-less common-mode filter. In some embodiments, the pattern has an L-shape or a rectangular shape.

In some embodiments, the pattern comprises a first section and a second section, the first and second sections being disjoint and non-intersecting. In some such embodiments, the first section is a linear segment and the second section is (a) an omega-shaped segment or (b) a U-shaped segment.

In some embodiments in which the pattern comprises first and second sections, the pattern has a T-shape. In some embodiments, a length of the via-less common-mode filter is between approximately 2 mm and approximately 7 mm. In some embodiments, a length of the via-less common-mode filter is between approximately 2.5 mm and approximately 3.5 mm, and a width of the via-less common-mode filter is between approximately 1 mm and approximately 2 mm.

In some embodiments the pattern comprises first, second, and third sections, wherein at least one dimension of the third section is substantially identical to a corresponding dimension of the second section.

In some embodiments the pattern comprises first, second, and third sections, wherein a shape of the third section is substantially identical to a shape of the second section. In some such embodiments, the first section is linear, and the second and third sections are U-shaped.

In some embodiments, the shield layer is a first shield layer, the ground layer is a first ground layer and is disposed on a first side of the signal layer, and the PCB further comprises a second shield layer and a second ground layer disposed between the second shield layer and a second side of the signal trace layer, the second ground layer comprising a mirror image of the pattern.

In some embodiments, a method of manufacturing a multi-layer metal circuit, such as a PCB and integrated circuits (e.g., implemented in semiconductor chips), comprises etching the pattern into the ground layer.

In some embodiments, a multi-layer metal circuit, such as a PCB and integrated circuits (e.g., implemented in semiconductor chips), comprises a shield layer, at least one signal trace, a reference layer disposed between the shield layer and the at least one signal trace, and a common-mode filter etched into the reference layer, wherein the common-mode filter is electrically isolated from the shield layer. In some embodiments, the common-mode filter comprises at least one piece-wise linear segment.

In some embodiments, the common-mode filter comprises a plurality of segments. In some such embodiments, the plurality of segments comprises at least one piece-wise linear segment. In some embodiments, the plurality of segments further comprises at least one linear segment. In some embodiments, the plurality of segments comprises a first segment and a second segment, wherein the first and second segments are substantially identical. In some embodiments, the plurality of segments comprises a first segment and a second segment, wherein at least one dimension of the first segment differs from a corresponding dimension of the second segment.

In some embodiments, a method of manufacturing a multi-layer metal circuit, such as a PCB and integrated circuits (e.g., implemented in semiconductor chips), with a partially- or fully-shielded via-less common-mode filter comprises fabricating the shield layer, fabricating the reference layer, etching the common-mode filter into the reference layer, and fabricating the at least one signal trace.

BRIEF DESCRIPTION OF THE DRAWINGS

Objects, features, and advantages of the disclosure will be readily apparent from the following description of certain embodiments taken in conjunction with the accompanying drawings in which:

FIG. 5A illustrates an exemplary via-less common-mode filter that includes three sections in accordance with some embodiments.

FIG. 5B illustrates an exemplary via-less common-mode filter that includes four sections in accordance with some embodiments.

To facilitate understanding, identical reference numerals have been used, where possible, to designate elements that are common to the figures. It is contemplated that elements disclosed in one embodiment may be beneficially utilized on other embodiments without specific recitation.

DETAILED DESCRIPTION

Figure 1A:
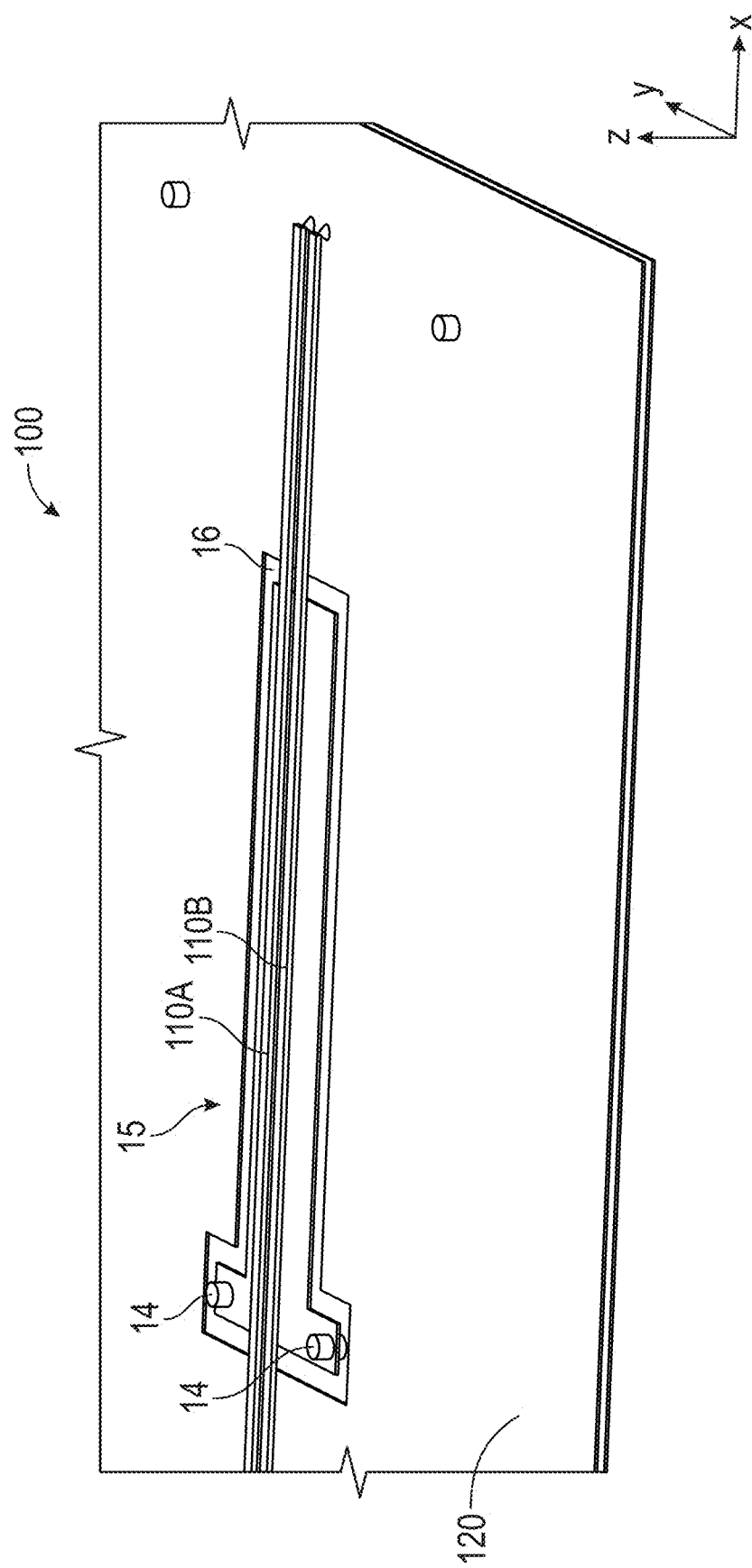
FIG. 1A is a perspective view of a portion of a PCB that includes an exemplary common-mode filter that uses vias.

In the following, reference is made to embodiments of the disclosure. It should be understood, however, that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim.

Common-mode noise filters can be used in electronic equipment (e.g., data storage devices, computers, etc.) to suppress common-mode noise and protect signal SNR. For example, signal detection electronics can include a filter circuit to filter common-mode noise. The inclusion of such a filter circuit, however, can increase the cost of the signal detection electronics. Alternatively, a common-mode filter can be mounted on the surface of a PCB through which the signal paths are routed. In some applications, however, there may be insufficient room on the PCB for surface-mounted filters. Moreover, use of one or more surface-mounted filters increases the cost of the populated PCB. In addition, the bandwidth of this type of filter is usually narrow and can only target one frequency at a time. Because a single filter may not provide sufficient attenuation of the common-mode noise, or may not provide sufficient attenuation at all frequencies at which common-mode noise is problematic (e.g., when the common-mode interference signals have a signal at a base frequency and higher harmonics), it may be necessary to use multiple common-mode filters to attenuate the common-mode noise adequately at the frequencies where it is problematic, thereby increasing the amount of space needed on the surface of the board when surface-mounted filters are used. Even when a single filter should be sufficient, manufacturing tolerances can cause the filter's frequency band to shift away from the target frequency band, which can reduce the effectiveness of the filter.

Another approach to mitigate common-mode noise is to add copper tape shielding to reduce EMI or RF interference to products that are susceptible to common-mode noise, but doing so adds manufacturing time and cost.

Therefore, the inclusion of one or more common-mode noise filters using one or more of the above-described approaches can increase the cost and/or size of the PCB and/or reduce the amount of PCB space available for other components.

Figure 1B:
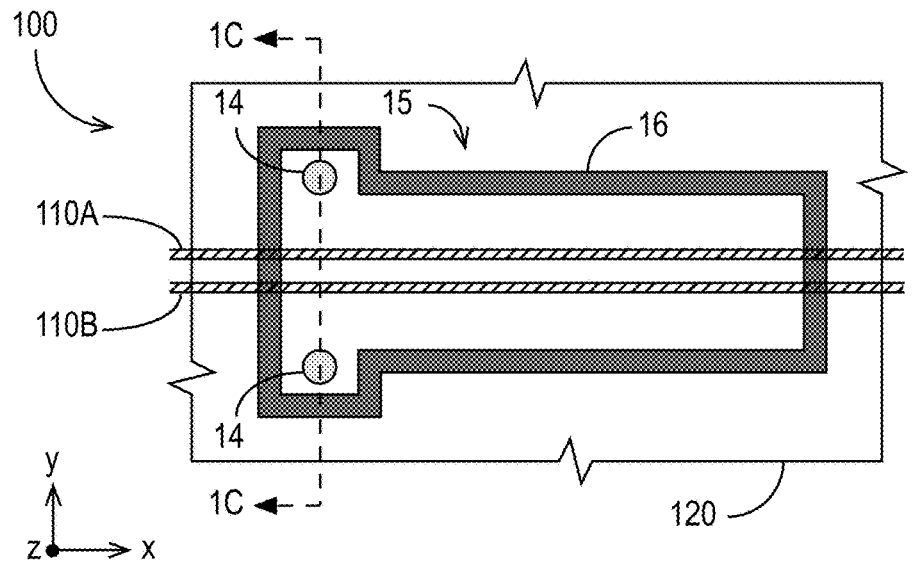
FIG. 1B is a top-view of the exemplary common-mode filter shown in FIG. 1A.
Figure 1C:
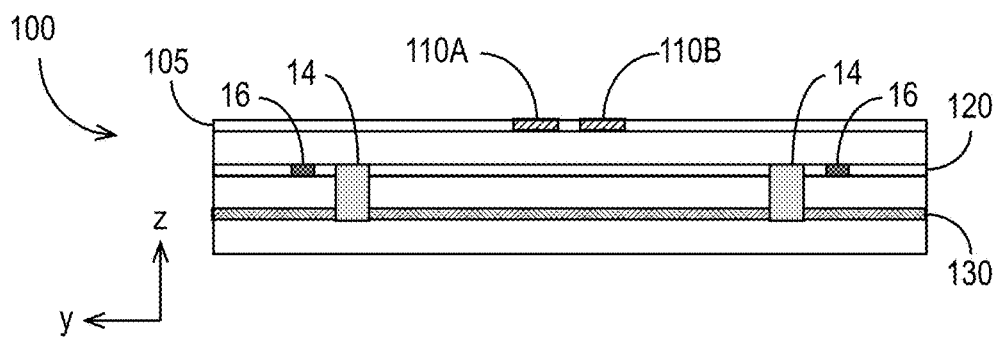
FIG. 1C is a cross-section view of the portion of the PCB at the location indicated in FIG. 1B.

An alternative approach is to build a common-mode noise filter into the PCB itself. FIG. 1A is a perspective view of a portion of a PCB 100 that includes a common-mode filter 15. FIG. 1B is a top-view of the common-mode filter 15 shown in FIG. 1A, and FIG. 1C is a cross-section view of the portion of the PCB 100 at the location indicated in FIG. 1B. FIGS. 1A, 1B, and 1C show only a portion of the PCB 100 that includes the common-mode filter 15, but for simplicity, the portion of the PCB 100 described will be referred to generally in this document as "the PCB 100."

For ease of explanation, a rectangular coordinate system is used to describe the orientation of the PCB 100 and its components, including the various common-mode filters described herein (e.g., in the context of FIGS. 1A, 1B, and 1C, as well as in the context of other drawings described below). The component surfaces of the PCB 100 and the large surfaces of its layers are arbitrarily designated to be in the x-y plane. Thus, FIG. 1B illustrates the PCB 100 layers from above or below, viewed in the x-y plane of a rectangular coordinate system. In FIG. 1B, the z-axis extends out of the page, toward the reader. FIG. 1C illustrates a cross-section of the PCB 100 at the location indicated by the dashed line in FIG. 1B. As shown, the cross-section is in the y-z plane of the defined rectangular coordinate system.

As shown in FIGS. 1A, 1B, and 1C, the common-mode filter 15 comprises a pair of vias 14 and a pattern 16 in the reference plane 120 (e.g., a ground plane) of a PCB 100. The common-mode filter 15 shown in FIGS. 1A, 1B, and 1C is referred to in the art as a patterned ground structure (PGS) filter because the pattern 16 comprises gaps made (e.g., etched) in the reference plane 120 (e.g., a ground plane) of the PCB 100.

For clarity of illustration, the pattern 16 is shown in FIG. 1B using a thick line. Thus, the presentation in FIG. 1B (and other similar figures herein) is similar to a negative of a photograph, in that the gaps making the pattern 16, which are areas in which material has been removed from the reference plane 120, are shown as darker lines, whereas the rest of the reference plane 120, from which material has not been removed, is shown without any shading. As explained above, the pattern 16 may be formed, for example, by etching the reference plane 120.

Signal traces 110A and 110B, which may support single-ended or differential signaling, are disposed in a signal trace layer 105 of the PCB 100, as shown in FIG. 1C. The signal trace layer 105 resides over (or under) the reference plane 120, and the signal traces 110A and 110B pass over the common-mode filter 15, as shown in FIGS. 1B and 1C. (It is to be understood that the signal trace layer 105 and the signal traces 110A and 110B could alternatively reside under the reference plane 120.) The signal traces 110A and 110B are offset from the reference plane 120 by some distance in the z-direction, as shown in FIG. 1C. Using the rectangular coordinate system established for FIGS. 1A, 1B, and 1C, the signal traces 110A and 11B extend along or parallel to the x-axis.

FIG. 1C shows a cross-section view of the PCB 100 of FIGS. 1A and 1B at the location indicated by the dashed line in FIG. 1B. FIG. 1C shows additional layers of the PCB 100, including the signal trace layer 105 in which the signal traces 110A and 110B reside, the reference plane 120 in which the pattern 16 is formed (e.g., etched), and the shield layer 130 to which the reference plane 120 is electrically connected by the vias 14. As is known in the art, a via is a small hole through a PCB that provides an electrical connection between different layers of a PCB. A via may be formed between two layers of a PCB by fabricating two pads in corresponding positions on the two layers of the PCB, and making a hole through the board between the two pads. The hole can be made conductive in any suitable way (e.g., by electroplating, by using a tube or rivet, etc.).

For clarity of illustration, the signal traces 110A and 110B are shown in isolation in FIGS. 1A and 1B, and in other figures herein, without the rest of the signal trace layer 105 illustrated. Likewise, other layers of the PCB 100 are not specifically illustrated (e.g., in FIG. 1C) to avoid obscuring the elements of interest for the present discussion. Such other layers may include, for example, layers of copper foil, prepreg, and FR-4 laminate.

Figure 1F:
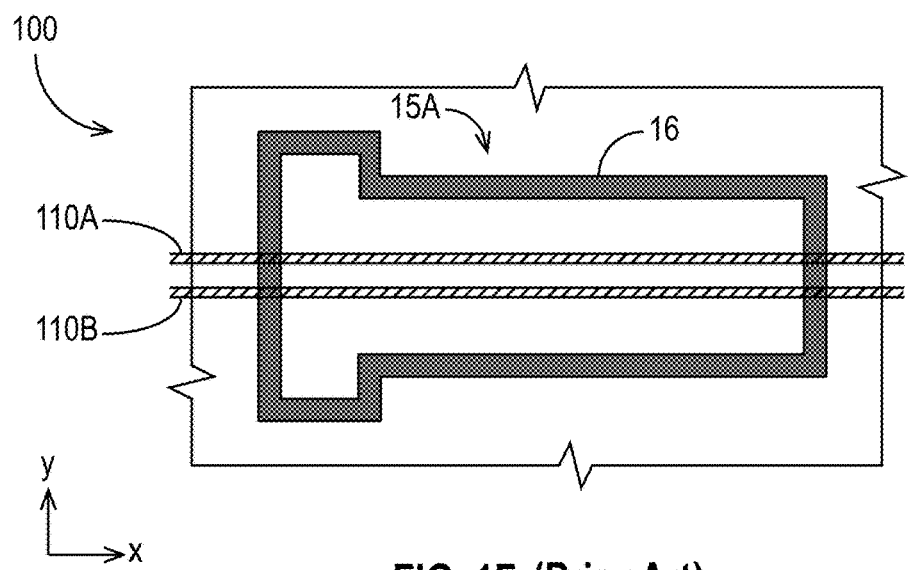
FIG. 1F shows a structure that results if the vias are removed from the exemplary common-mode filter of FIGS. 1A-1C.
Figure 1D:
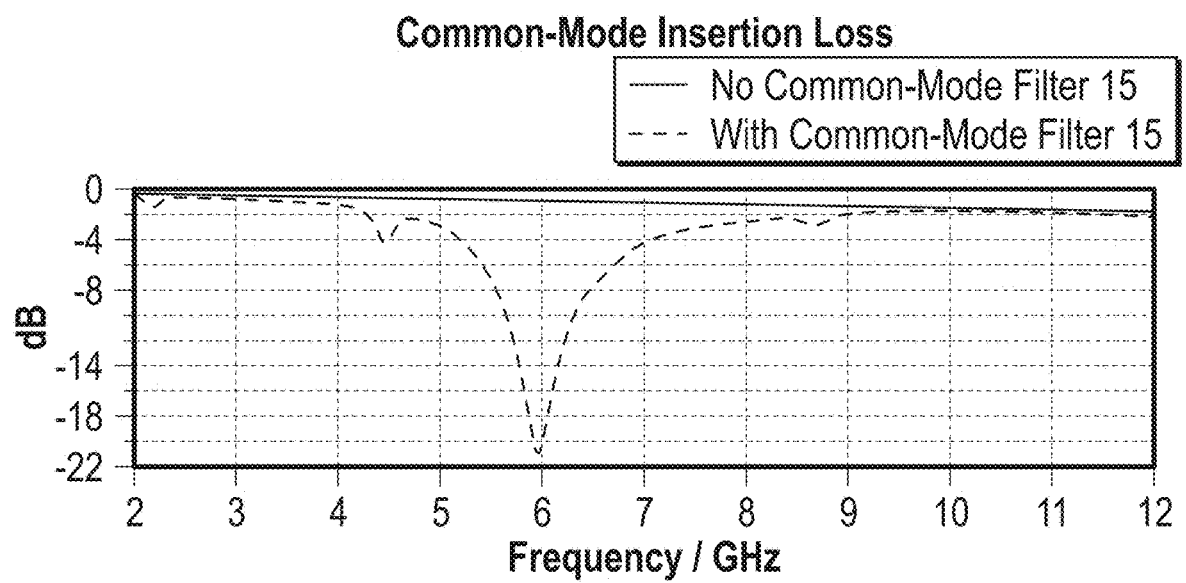
FIG. 1D is a plot comparing the common-mode insertion loss when a PCB includes and does not include the exemplary common-mode filter 15 shown in FIGS. 1A, 1B, and 1C.
Figure 1E:
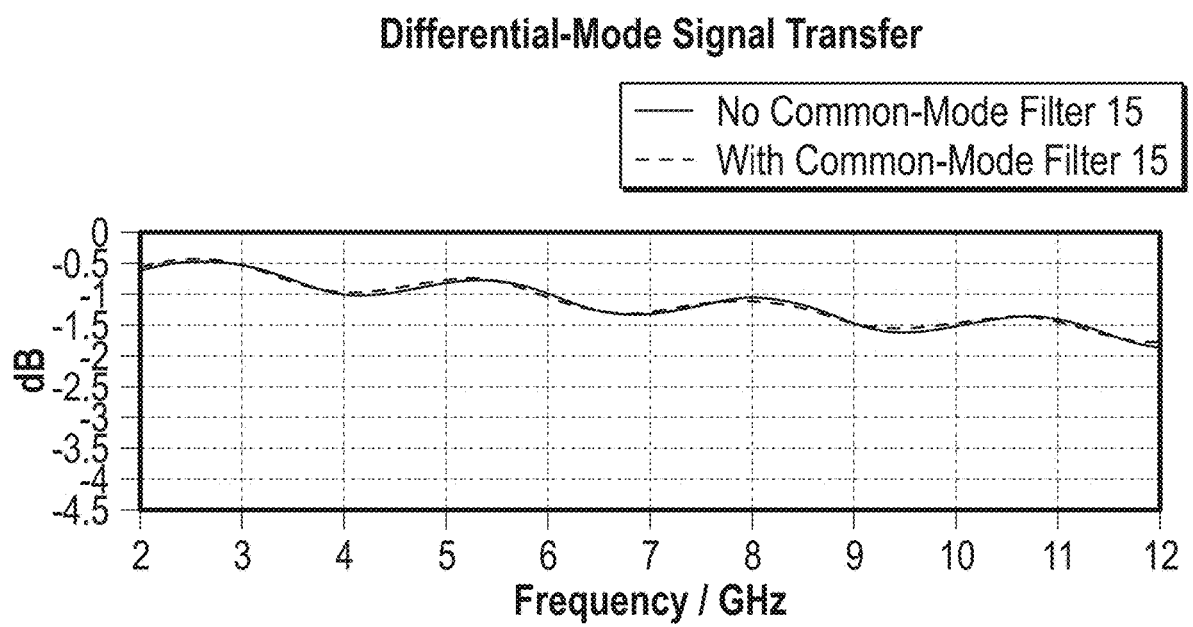
FIG. 1E is a plot comparing the differential-mode signal transfer with and without the exemplary common-mode filter shown in FIGS. 1A-1C.

FIG. 1D is a plot comparing the common-mode insertion loss when a PCB includes and does not include the common-mode filter 15 shown in FIGS. 1A, 1B, and 1C, and FIG. 1E is a plot comparing the differential-mode signal transfer with and without the common-mode filter 15. As is clear from FIG. 1D, the inclusion of the common-mode filter 15 causes a deep notch of about 21 dB at approximately 6 GHz. Thus, the common-mode filter 15 attenuates the common-mode noise by approximately 21 dB at 6 GHz. As is clear from FIG. 1E, the inclusion of the common-mode filter 15 has a negligible effect on the differential-mode signal transfer at all frequencies shown. Thus, the inclusion of PGS filters like common-mode filter 15 in a PCB can be an effective strategy to reduce the undesirable effects of common-mode noise without adversely affecting differential-mode signal transfer.

One issue with common-mode noise filters that use vias 14 (e.g., common-mode filter 15) is that the vias 14 consume space on the PCB. Although the need for vias 14 may not be an issue for larger PCBs, for smaller PCBs, even the small amount of space needed for the vias 14 may preclude the use of the common-mode filter 15 with vias 14. Furthermore, the use of vias 14 may be impractical or impossible in other types of multi-layer metal circuits, such as, for example, integrated circuits (e.g., implemented in semiconductor chips). Thus, there is a need for PGS filters that do not use vias 14 but that still provide the benefits of the common-mode filter 15, such as substantial suppression of common-mode noise in a selected frequency band or at a selected frequency without a substantial adverse effect on differential-mode signal transfer.

Figure 1G:
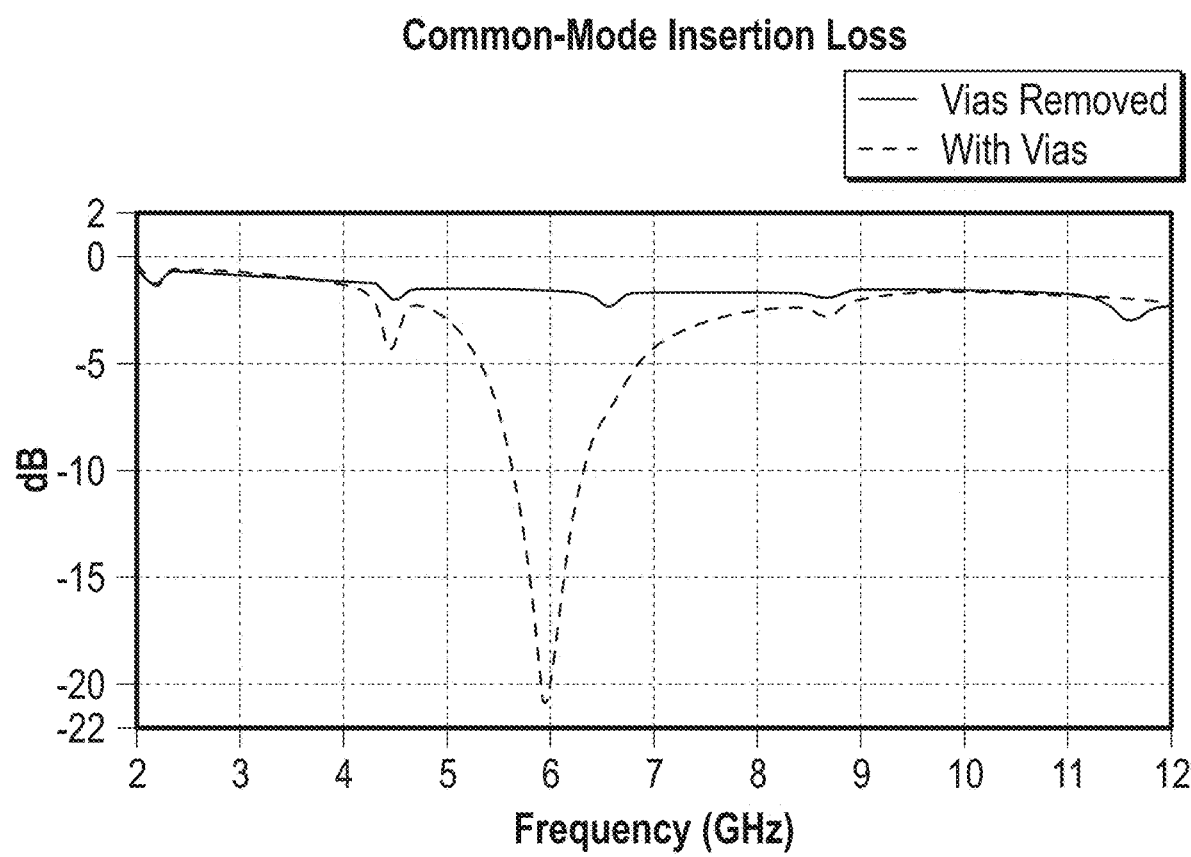
FIG. 1G shows the effect of removing the vias from the exemplary common-mode filter of FIGS. 1A-1C.

Unfortunately, if the vias 14 are simply removed from the common-mode filter 15, thus electrically disconnecting the common-mode filter 15 from the shield layer 130, resulting in the structure 15A shown in FIG. 1F, the structure 15A no longer functions as a filter. FIG. 1G compares the common mode insertion loss of the common-mode filter 15 shown in FIGS. 1A-1C ("With Vias") to that of the structure 15A shown in FIG. 1F ("Vias Removed"). As FIG. 1G shows, without the vias 14 to connect the reference plane 120 to the shield layer 130, the structure 15A shown in FIG. 1F no longer provides a deep notch at any frequency. Thus, when the vias 14 are removed from the common-mode filter 15, leaving only the structure 15A, that structure 15A ceases to be an effective common-mode filter. Accordingly, a new design strategy is needed that provides compact common-mode noise filters that do not require vias 14 but still provide attenuation of common-mode noise without a substantial impact on differential mode signal transfer.

Disclosed herein are such via-less common-mode filters. The disclosed via-less common-mode filters can be single-sided, partially-shielded, or fully-shielded. Whether single-sided, partially-shielded, or fully-shielded, they do not require any electrical connection to a shield layer. Although the exemplary via-less common-mode filters are described herein in the context of PCBs, it is to be understood that the disclosed via-less common mode filters are suitable for use not only in PCBs, but also in other multi-layer metal circuits (e.g., integrated circuit chips).

Figure 2A:
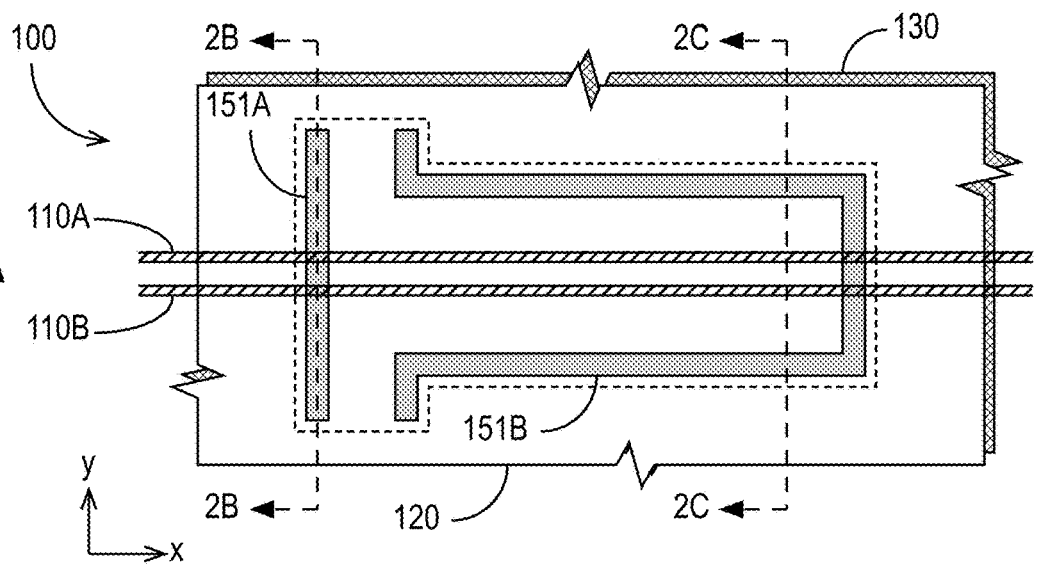
FIG. 2A is a top view of a PCB that includes an exemplary single-sided via-less common-mode filter in accordance with some embodiments.
Figure 2B:
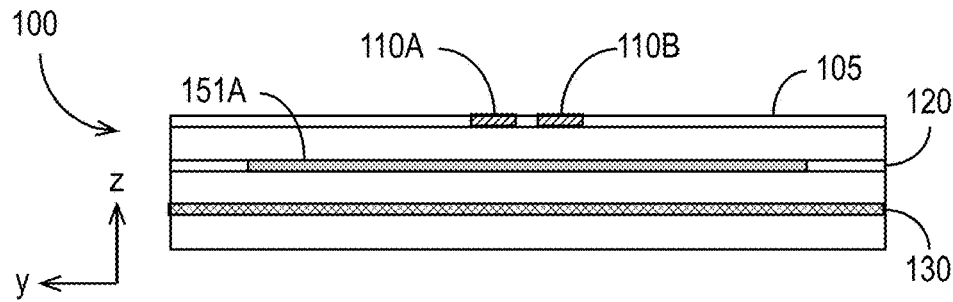
FIGS. 2B and 2C are cross-section views of the PCB of FIG. 2A at the locations indicated in FIG. 2A.
Figure 2C:
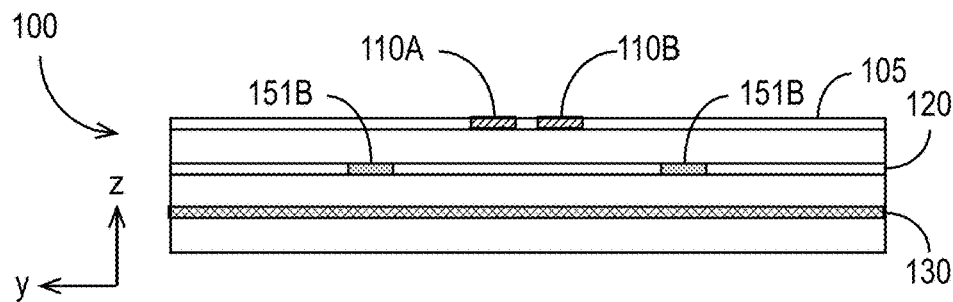

FIGS. 2A, 2B, and 2C illustrate a PCB 100 that includes an exemplary via-less common-mode filter 150A in accordance with some embodiments. The PCB 100 includes a signal trace plane 105, a reference plane 120 (e.g., a ground plane), and a shield layer 130. FIG. 2A is a top view of the via-less common-mode filter 150A, and FIGS. 2B and 2C are cross-section views of the PCB 100 at the locations indicated in FIG. 2A. As explained above in the context of FIGS. 1A-1C, although FIGS. 2A-2C show only a portion of the PCB 100 that includes the via-less common-mode filter 150A, for simplicity, the portion of the PCB 100 will be referred to herein as "the PCB 100." As in FIGS. 1A-1C, a rectangular coordinate system is used to describe the orientation of the PCB 100 and its components, including the via-less common-mode filter 150A, with the component surfaces of the PCB 100 and its layers arbitrarily designated to be in the x-y plane as indicated in FIG. 2A. Thus, FIG. 2A illustrates the PCB 100 layers from above or below, viewed in the x-y plane in a rectangular coordinate system. The z-axis extends out of the page, toward the reader.

Like the common-mode filter 15 of FIGS. 1A-1C, the via-less common-mode filter 150A shown in FIGS. 2A, 2B, and 2C comprises a pattern that is formed (e.g., etched) in a reference plane 120 (e.g., a ground plane) of the PCB 100. Unlike the common-mode filter 15 of FIGS. 1A-1C, however, the via-less common-mode filter 150A shown in FIGS. 2A-2C does not include any vias 14 connecting the via-less common-mode filter 150A to the shield layer 130. As shown in FIGS. 2A, 2B, and 2C, the via-less common-mode filter 150A is single-sided, with the shield layer 130 residing on the other side of the reference plane 120 from the signal traces 110A, 110B.

The exemplary via-less common-mode filter 150A uses a pattern that includes two disjoint (e.g., non-intersecting) sections, 151A and 151B. Both of section 151A and section 151B of the pattern are formed (e.g., etched) in the reference plane 120. In the exemplary embodiment of via-less common-mode filter 150A, the section 151A is a linear segment, and the section 151B is a segment that is shaped similarly to the Greek letter omega. Thus, the section 151B is referred to as "omega-shaped." Overall, the exemplary via-less common-mode filter 150A has the shape of the letter "T" and, therefore, is said to have a "T shape" in the x-y plane.

Signal traces 110A and 110B, which are disposed in a signal trace layer 105 of the PCB 100, pass over the via-less common-mode filter 150A. (It is to be understood that the signal traces 110A and 110B could alternatively pass under the via-less common-mode filter 150A, in which case the shield layer 130 would be above the reference layer 120.) As explained above in the context of FIGS. 1A and 1B, for clarity of illustration, the signal traces 110A and 110B are shown in isolation in FIG. 2A, without the rest of the signal trace layer 105 illustrated.

Figure 2D:
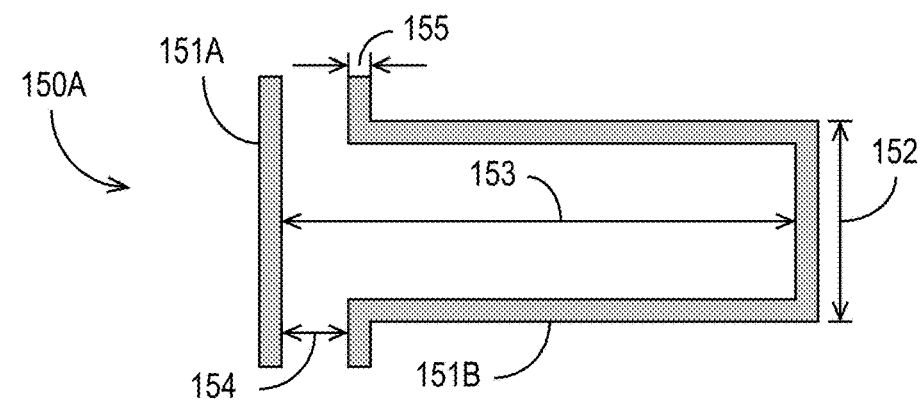
FIG. 2D illustrates the reference-plane pattern of the exemplary via-less common-mode filter of FIG. 2A.

FIG. 2D illustrates the reference-plane pattern of the via-less common-mode filter 150A in isolation to illustrate various dimensions of the via-less common-mode filter 150A. The via-less common-mode filter 150A has a width 152 and a length 153. The width 152 may be any suitable value. For example, for some applications, the width 152 may be between approximately 1 mm and approximately 2 mm. The length 153 may also be any suitable value. For example, for some applications, the length 153 may be between approximately 2 mm and approximately 7 mm. As shown in FIGS. 2A and 2D, the exemplary via-less common-mode filter 150A also includes a gap 154 between the first section 151A and the second section 151B. The gap 154 may be any suitable value. For example, for some applications, the gap 154 may be greater than zero and less than about 0.5 mm. The width of the sections 151A and 151B is denoted as 155. Although FIGS. 2A and 2D illustrate the first section 151A and second section 151B as having the same widths 155, their widths 155 may be different. The width(s) 155 may be any suitable value. For example, for some applications, the width(s) 155 may be greater than zero and less than approximately 0.5 mm.

It will be appreciated that the dimensions of the via-less common-mode filter 150A may be constrained by external factors, such as, for example, the amount of PCB (or, generally, multi-layer metal circuit) area available, the dimensions, characteristics (e.g., whether meandering or straight, material, etc.), and locations of the signal traces (e.g., 110A, 110B), the expected frequency or frequencies of common-mode noise, etc. The values provided herein are merely exemplary, and other values are contemplated and are within the scope of the disclosure.

Figure 2E:
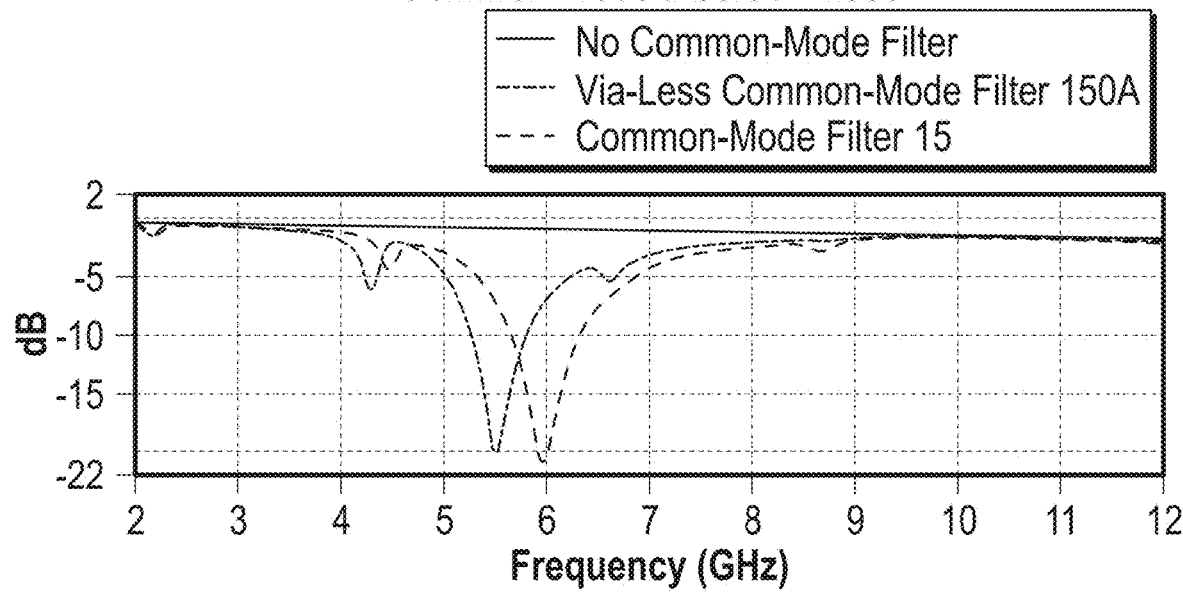
FIG. 2E is a plot comparing the common-mode insertion loss without any common-mode filter, with the exemplary common-mode filter shown in FIGS. 1A through 1C, and with the exemplary via-less common-mode filter shown in FIGS. 2A through 2D.

FIG. 2E is a plot comparing the common-mode insertion loss of a PCB without any common-mode filter (solid line), with the common-mode filter 15 shown in FIGS. 1A through 1C (dashed line), and with the exemplary via-less common-mode filter 150A shown in FIGS. 2A through 2D (dash-dot line). The dimensions of the via-less common-mode filter 150A used to create FIG. 2E are a width 152 of 2.406 mm, a length 153 of 6.11 mm, a gap 154 of 0.42 mm, and an etch width 155 of 0.2 mm. As is clear from FIG. 2E, the common-mode filter 15 shown in FIGS. 1A-1C attenuates the common-mode noise by about 21 dB at approximately 6 GHz, and the exemplary via-less common-mode filter 150A shown in FIGS. 2A-2D attenuates the common-mode noise by about 20 dB at about 5.5 GHz.

By changing the dimensions of the via-less common-mode filter 150A, the frequency and depth of the notch can be adjusted. For example, the width 152, length 153, gap 154, and widths 155 of the first and second sections can be adjusted to adjust the frequency of the notch. In particular, the length 153 of the via-less common-mode filter 150A has a significant impact on the notch frequency. Accordingly, the dimensions of the exemplary via-less common-mode filter 150A can be adjusted to provide a notch at 6 GHz, if desired, or at another frequency at which common-mode noise is expected. And, as explained further below, more complicated filter structures (e.g., made by concatenating more than two sections 151A, 151B of the pattern in series) allow the notch width, frequency, and depth to be adjusted.

Figure 2F:
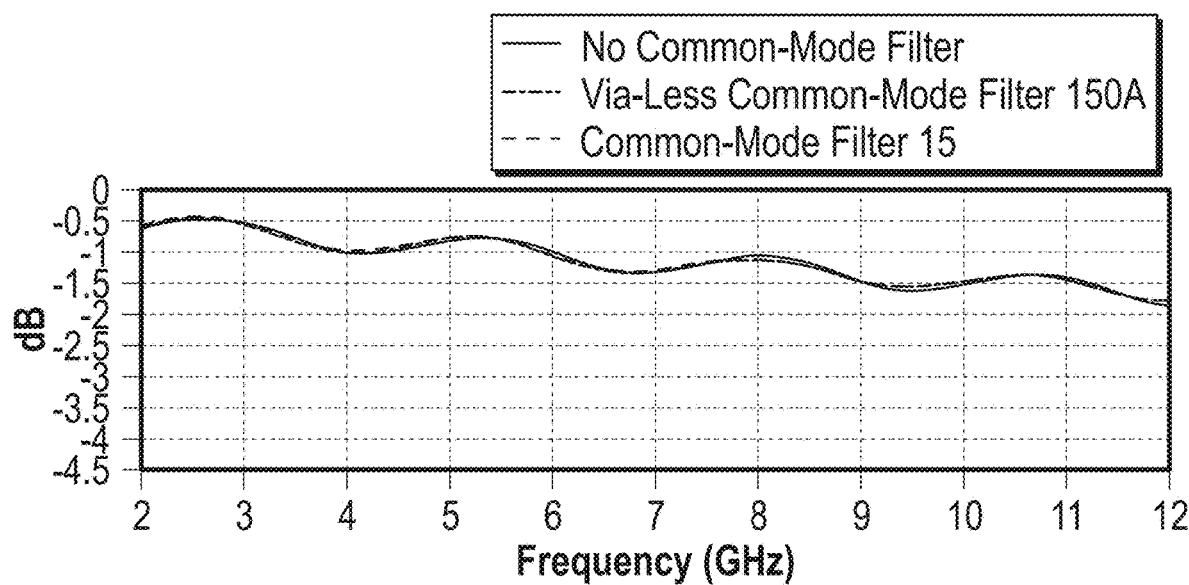
FIG. 2F is a plot comparing the differential-mode signal transfer without any common-mode filter, with the exemplary common-mode filter shown in FIGS. 1A through 1C, and with the exemplary via-less common-mode filter shown in FIGS. 2A through 2D.

FIG. 2F is a plot comparing the differential-mode signal transfer without any common-mode filter (solid line), with the common-mode filter 15 shown in FIGS. 1A through 1C (dashed line), and with the exemplary via-less common-mode filter 150A shown in FIGS. 2A through 2D (dash-dot line) and described above. As is clear from FIG. 2F, like the inclusion of the common-mode filter 15, the inclusion of the exemplary via-less common-mode filter 150A has a negligible effect on the differential-mode signal transfer at all frequencies shown.

As explained in the context of FIGS. 1F and 1G, the common-mode filter 15 uses vias 14 to electrically connect the common-mode filter 15 to a shield layer 130. In contrast, as also explained above, the exemplary via-less common-mode filter 150A shown in FIGS. 2A-2C does not include vias 14 and is shown single-sided, meaning with a shield on only one side of the common-mode filter 150A. Thus, the via-less common-mode filter 150A provides flexibility with respect to the common-mode filter 15 in that it provides frequency-selective common-mode noise filtering without the need to electrically connect the via-less common-mode filter 150A to the shield layer 130. Consequently, the vial-less common-mode filter 150A, and other via-less common-mode filters described herein, can be used in PCBs and other multi-layer metal circuit applications in which the use of vias 14 is not feasible or desirable.

Figure 3A:
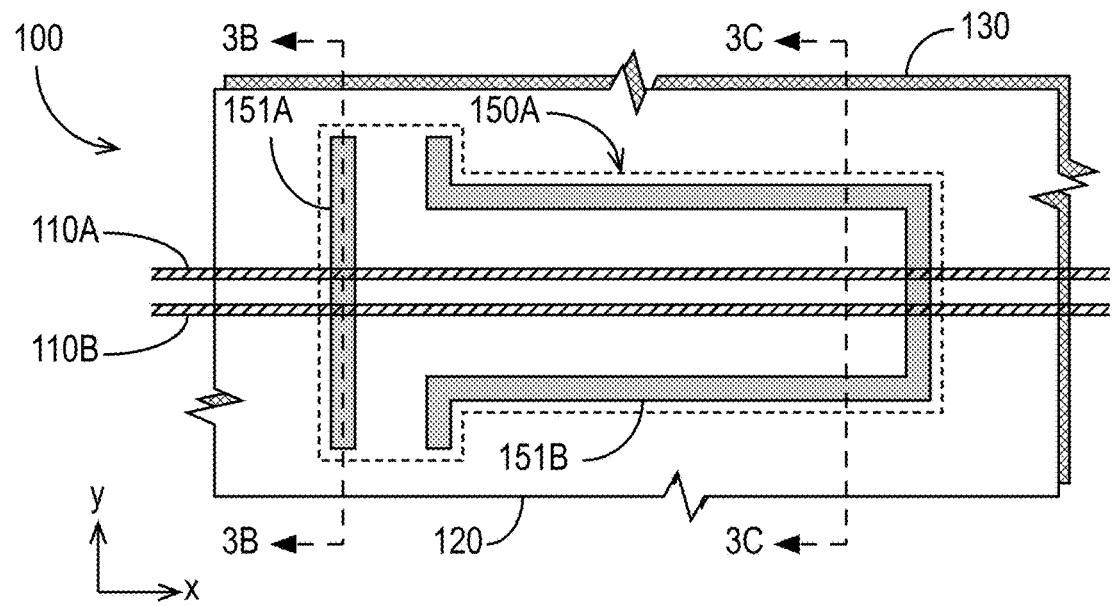
FIGS. 3A, 3B, and 3C illustrate a PCB with an exemplary partially-shielded via-less common-mode filter in accordance with some embodiments.
Figure 3B:
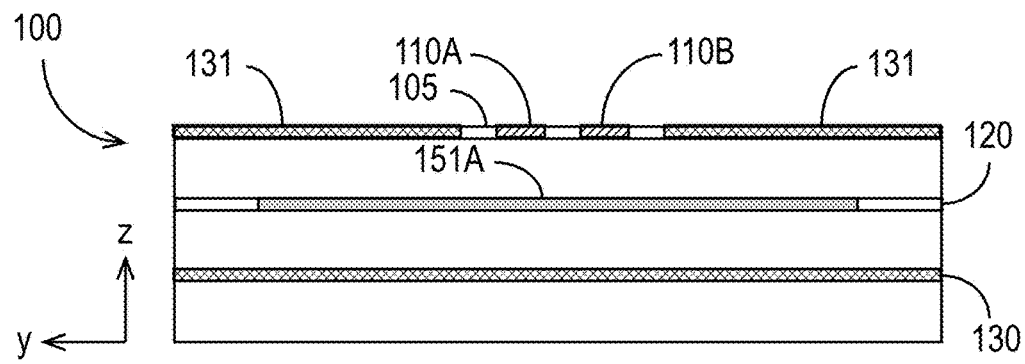
Figure 3C:
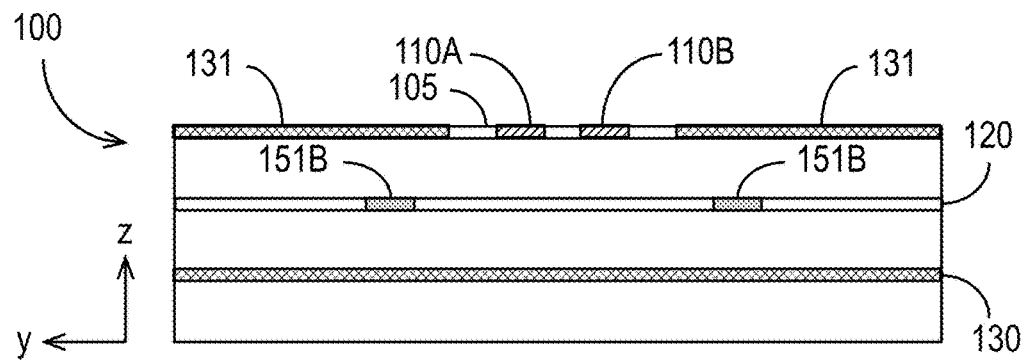

It is also possible for the via-less common-mode filter 150A to be partially or fully shielded. FIGS. 3A, 3B, and 3C illustrate a PCB 100 with a partially-shielded exemplary via-less common-mode filter 150A in accordance with some embodiments. In addition to the shield layer 130 below the via-less common-mode filter 150A, shown offset from the reference plane 120 so that it can be seen in the top view of FIG. 3A, the PCB 100 shown in FIGS. 3A-3C includes a partial shield 131 in the signal plane layer 105 (not illustrated in FIG. 3A to avoid obscuring the via-less common-mode filter 150A).

FIGS. 3B and 3C are cross-section views of the PCB 100 at the locations indicated in FIG. 3A. As shown in FIGS. 3B and 3C, the pattern of the via-less common-mode filter 150A is disposed on (e.g., etched into) the reference layer 120, which is disposed between the shield layer 130 and the signal trace layer 105. The signal trace layer 105 includes a partial shield 131 on either side of the signal traces 110A, 110B.

Figure 3D:
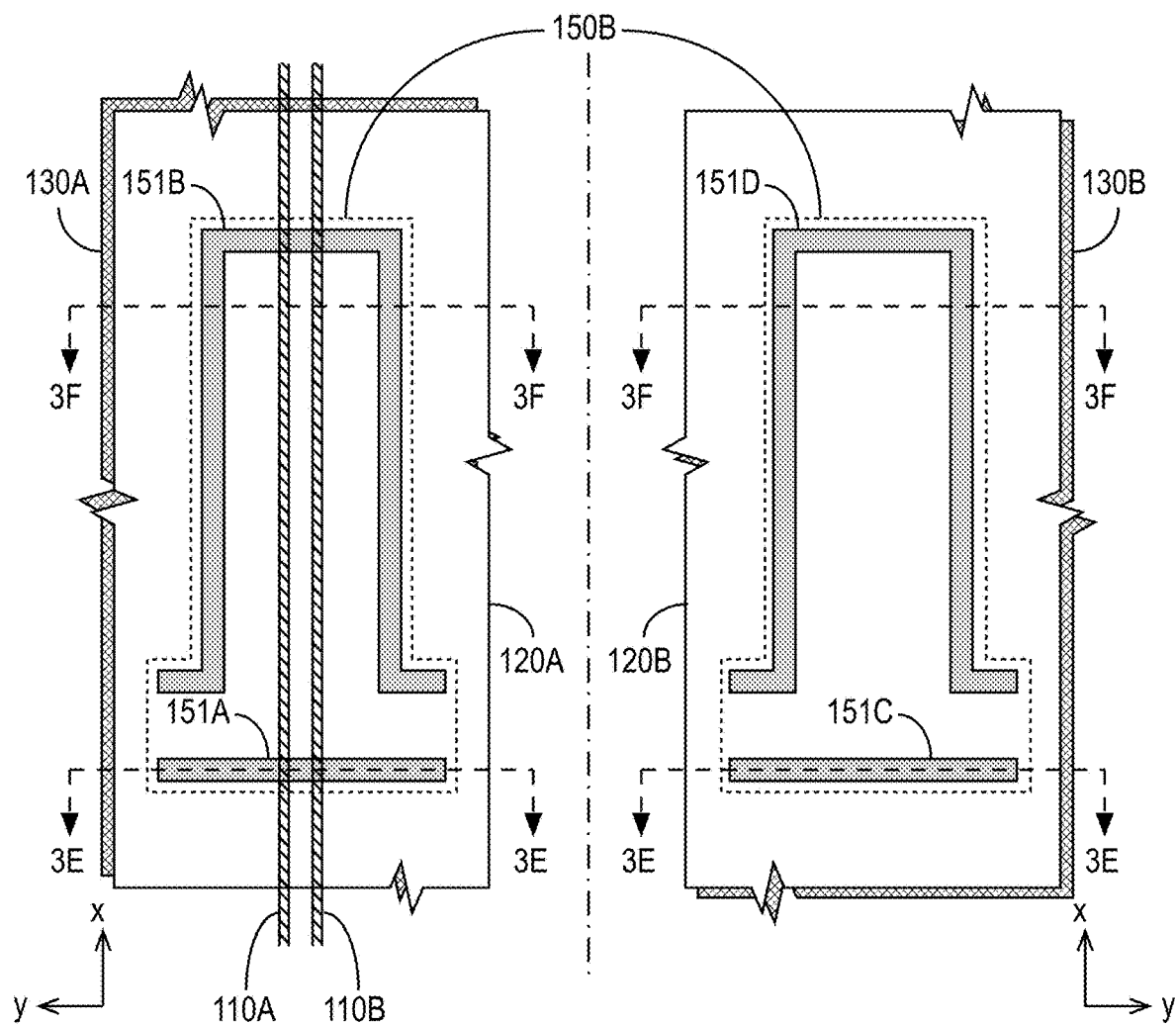
FIGS. 3D, 3E, and 3F illustrate a PCB with an exemplary fully-shielded via-less common-mode filter in accordance with some embodiments.
Figure 3E:
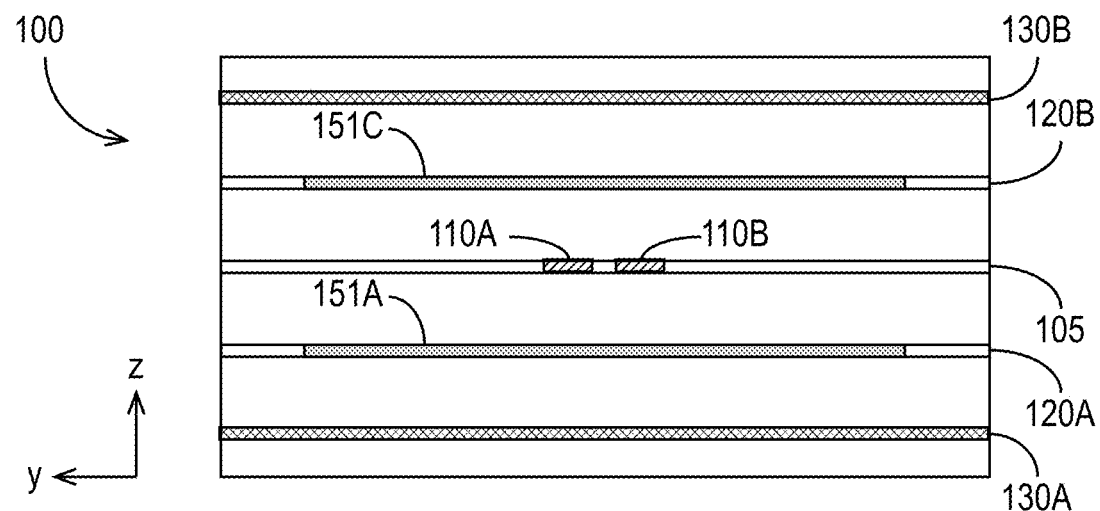
Figure 3F:
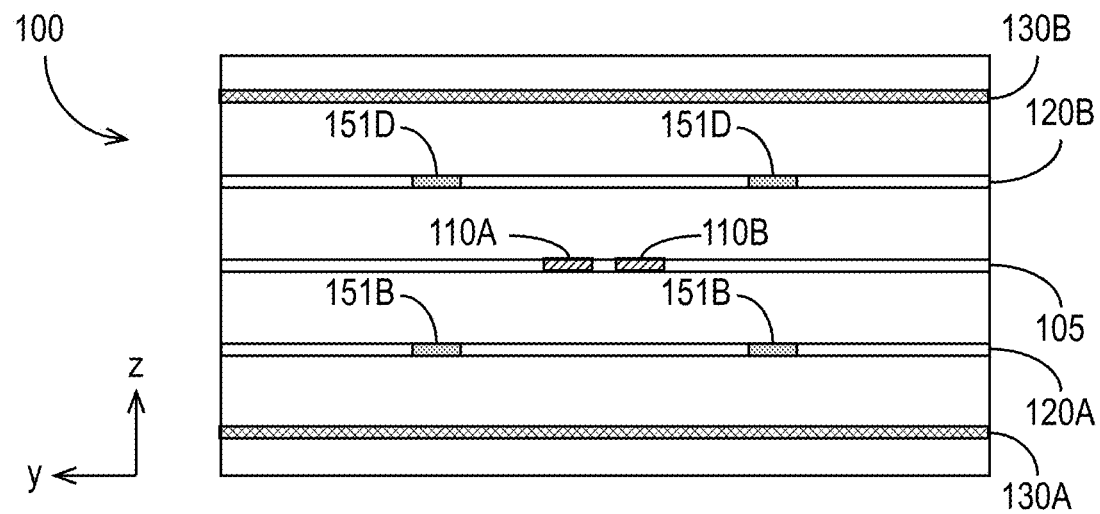

FIGS. 3D, 3E, and 3F illustrate a PCB 100 with a fully-shielded exemplary via-less common-mode filter 150B in accordance with some embodiments. FIG. 3D shows views in the x-y plane, and FIGS. 3E and 3F are cross-section views of the PCB 100 at the locations indicated in FIG. 3D. The PCB 100 is shown in two portions in FIG. 3D to illustrate various layers and components. As shown in FIG. 3D, the fully-shielded via-less common-mode filter 150B is formed by etching mirror images of a pattern into two reference layers 120A and 120B. The fully-shielded via-less common-mode filter 150B comprises mirror images of the first and second sections. Specifically, as shown in FIG. 3D, the first section 151A is the mirror image of the first section 151C, and the second section 151B is the mirror image of the second section 151D. In an implementation, the portion of the PCB 100 shown on the right-hand side of the page would be flipped (transposed) about the dash-dot line shown in FIG. 3D and would rest upside-down on the portion of the PCB 100 shown on the left-hand side of the page. (Alternatively, of course, the portion of the PCB 100 shown on the left-hand side of the page could be flipped about the dash-dot line and rest upside-down on the portion of the PCB 100 shown on the right-hand side of the page.) Thus, the via-less common-mode filter 150B, which includes the mirror-image patterns in the reference layers 120A and 120B, is sandwiched by two shield layers 130A and 130B, as shown in the cross-section views of FIGS. 3E and 3F.

Figure 3G:
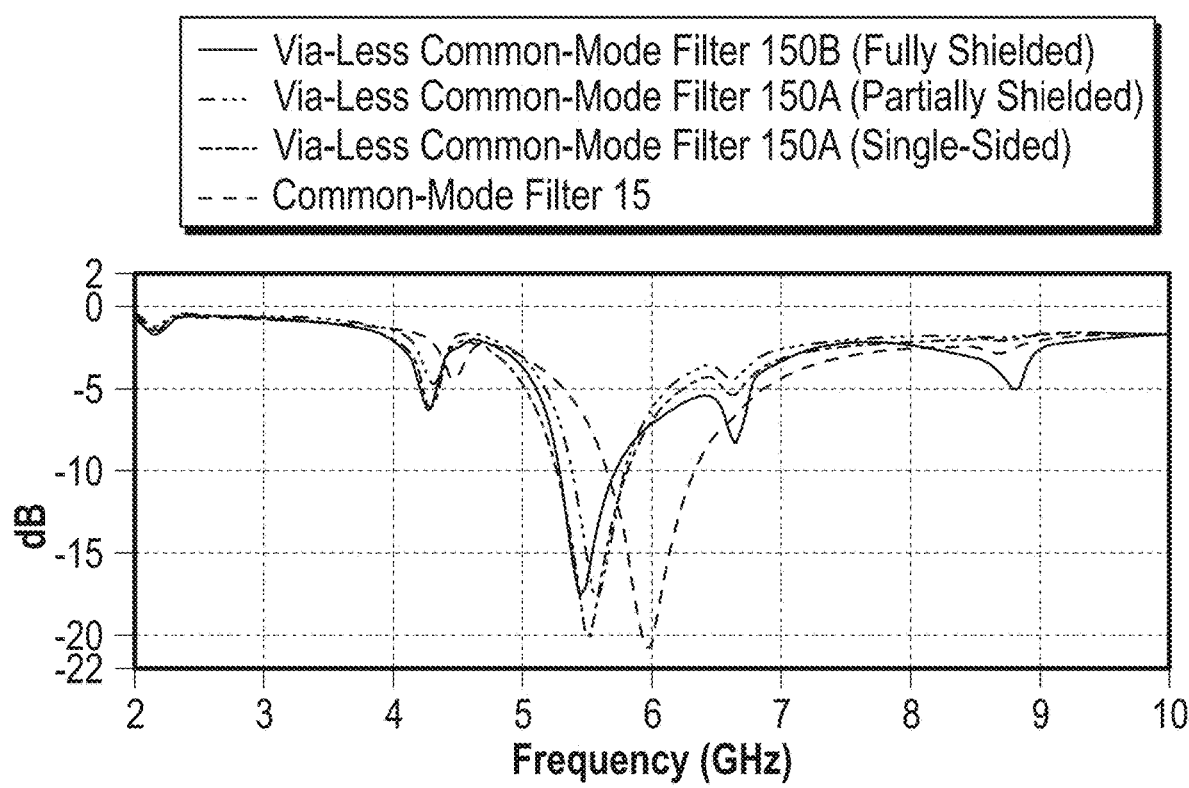
FIG. 3G shows the effect of partial and full shielding on the common-mode insertion loss of an exemplary via-less common-mode filter in accordance with some embodiments.

FIG. 3G shows the effect of partial and full shielding on the common-mode insertion loss of the exemplary via-less common-mode filter. For reference, the common-mode insertion loss of the common-mode filter 15 is shown (dashed line). The common-mode filter 15 provides about 21 dB of attenuation at about 6 GHz. The single-sided via-less common-mode filter 150A (e.g., illustrated in FIGS. 2A-2C) provides approximately 20 dB of attenuation at about 5.5 GHz. The partially-shielded via-less common-mode filter 150A (e.g., illustrated in FIGS. 3A-3C) provides about 17.5 dB of attenuation at about 5.6 GHz, and the fully-shielded via-less common-mode filter 150B (e.g., illustrated in FIGS. 3D-3F) provides about 17.5 dB of attenuation at 5.4 GHz. Thus, relative to the depth of the notch provided by the single-sided via-less common-mode filter 150A, partial- or full-shielding reduces the notch depth by 2-3 dB. Even fully shielded, however the via-less common-mode filter 150B still provides around 17.5 dB of attenuation. As explained above and described further below, the dimensions of the via-less common-mode filters 150A, 150B (e.g., width 152, length 153, gap 154, etch width(s) 155) can be modified to modify the depth, frequency, width, etc. of the notch or stopband.

Figure 4A:
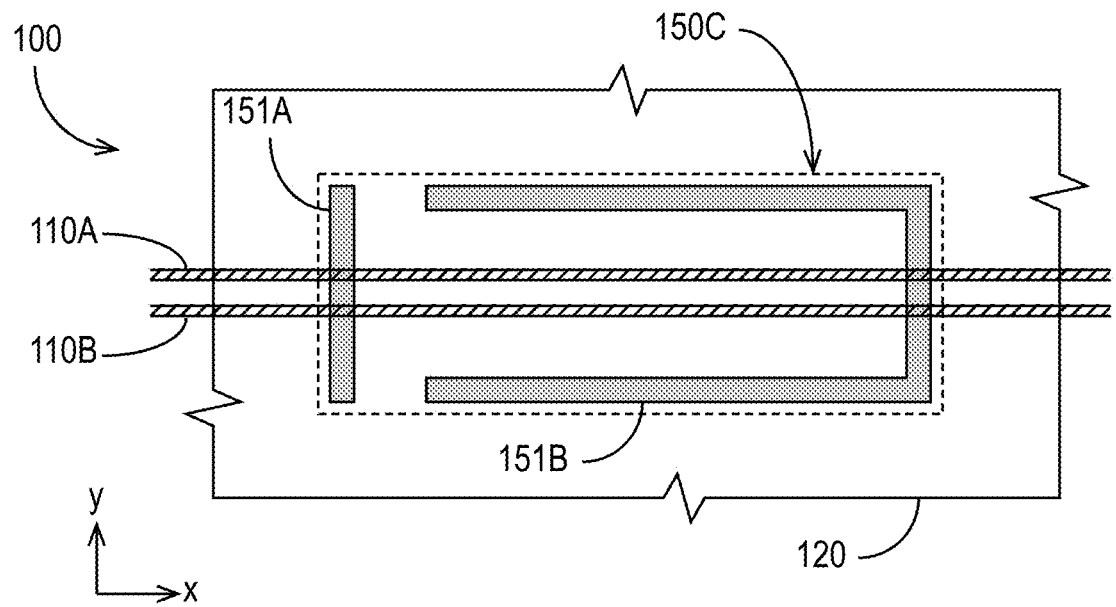
FIG. 4A is a top view of a PCB that includes an exemplary via-less common-mode filter in accordance with some embodiments.
Figure 4B:
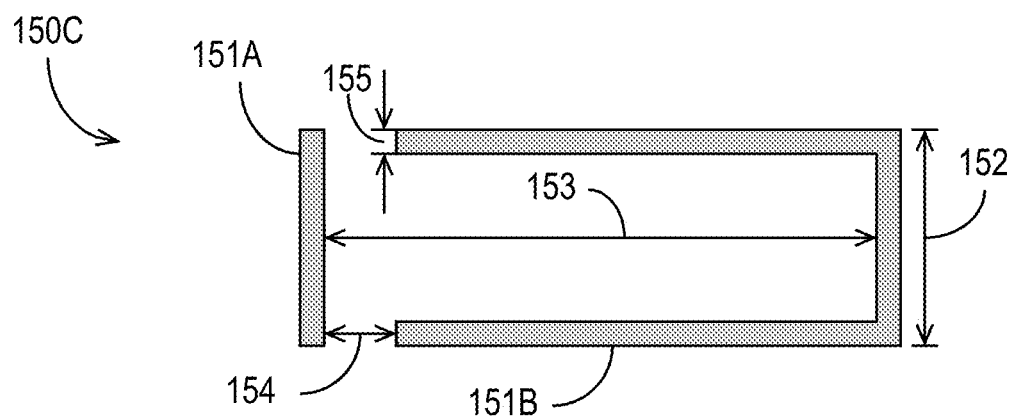
FIG. 4B shows the reference-plane pattern of the exemplary via-less common-mode filter of FIG. 4A.

The exemplary via-less common-mode filters 150A and 150B retain the "T" shape of the common-mode filter 15 but do not use vias 14, thereby allowing the filter to be implemented in a smaller space of the PCB 100. In some applications, it may be desirable to reduce the size and/or form factor even further. FIGS. 4A and 4B show another exemplary via-less common-mode filter 150C in accordance with some embodiments. FIG. 4A is a top view (x-y plane) of a PCB 100 that includes the exemplary via-less common-mode filter 150C, and FIG. 4B shows the pattern of the exemplary via-less common-mode filter 150C in isolation. Like the above-described exemplary via-less common-mode filters 15, 150A, and 150B, the exemplary via-less common-mode filter 150C is formed (e.g., etched) in a reference plane 120 (e.g., a ground plane) of the PCB 100. Like the exemplary via-less common-mode filters 150A and 150B illustrated in FIGS. 2A-2D and FIGS. 3A-3F, the exemplary via-less common-mode filter 150C shown in FIGS. 4A and 4B does not include any vias 14. The signal traces 110A and 110B and other aspects of the PCB 100 were described in the context of FIGS. 1A, 1B, 2A, and/or 3A. That description applies here and is not repeated.

Like the exemplary via-less common-mode filter 150A, the exemplary via-less common-mode filter 150C has two disjoint (e.g., non-intersecting) sections, 151A and 151B. Both of section 151A and section 151B are formed (e.g., etched) in the reference plane 120. The section 151A is a linear segment, and the section 151B is a segment that is U-shaped. Overall, as shown in FIGS. 4A and 4B, the exemplary via-less common-mode filter 150C has the shape of a rectangle in the x-y plane.

Like the common-mode filter 150A, the via-less common-mode filter 150C has a width 152 and a length 153, each of which may be any suitable value. The width 152 of the via-less common mode filter 150C may be, in general, less than the width 152 of the via-less common-mode filters 150A and 150B. The width 152 may be, for example, between approximately 1 mm and approximately 2 mm. The length 153 may be between approximately 2 mm and approximately 7 mm, for example. The exemplary via-less common-mode filter 150C also includes a gap 154 between the first section 151A and the second section 151B. The gap 154 may be any suitable value (e.g., greater than zero and less than about 0.5 mm). The width of the sections 151A and 151B is denoted as 155. Although FIGS. 4A and 4B illustrate the first section 151A and second section 151B as having the same widths 155, their widths 155 may be different. The width(s) 155 may be any suitable value. For example, the width(s) 155 may be greater than zero and less than approximately 0.5 mm.

It will be appreciated that the dimensions of the via-less common-mode filter 150C may be constrained by external factors, such as, for example, the amount of PCB (or other multi-layer metal circuit) area available, the dimensions and locations of the signal traces (e.g., 110A, 110B), the expected frequency or frequencies of common-mode noise, etc. The values provided herein are merely exemplary. Other values are specifically contemplated and are not excluded. As will be shown and discussed below, the length 153 of the via-less common-mode filter 150C has a significant impact on the notch frequency.

Figure 4C:
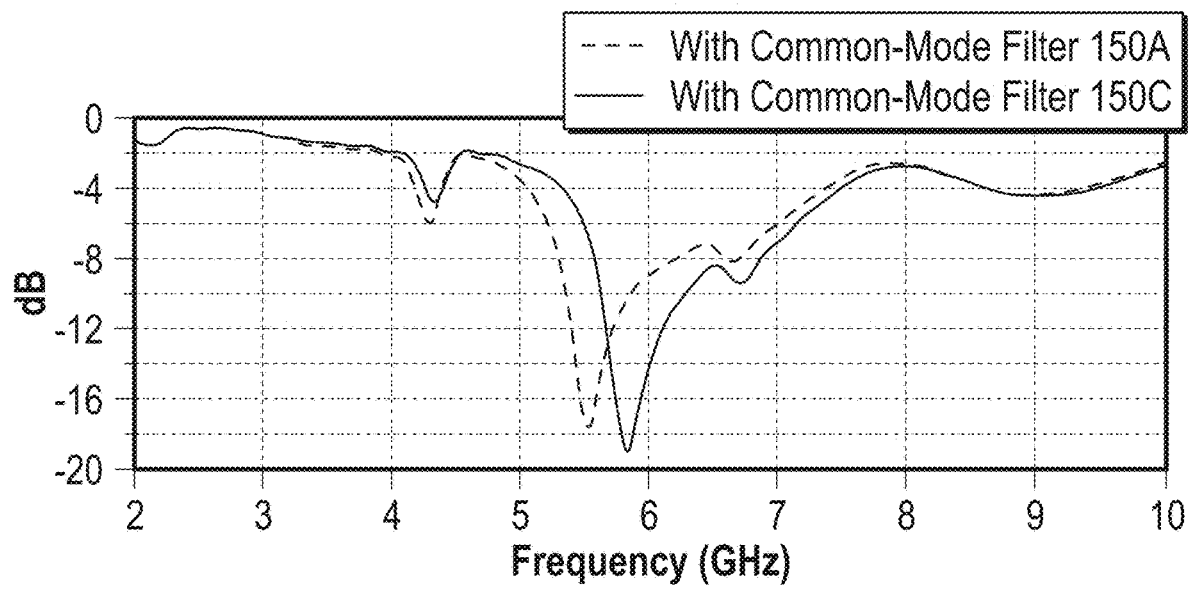
FIG. 4C is a plot comparing the common-mode insertion loss of a PCB with an exemplary T-shaped via-less common-mode filter and with an exemplary rectangular-shaped via-less common-mode filter in accordance with some embodiments.

FIG. 4C is a plot comparing the common-mode insertion loss of a PCB 100 with an exemplary T-shaped via-less common-mode filter (e.g., 150A shown in FIGS. 3A-3C) (dashed line), and with an exemplary rectangular-shaped via-less common-mode filter (e.g., 150C shown in FIGS. 4A and 4B) (solid line), both partially shielded. The exemplary T-shaped via-less common-mode filter 150A attenuates the common-mode noise by about 17.5 dB at about 5.5 GHz, whereas the exemplary rectangular-shaped via-less common-mode filter 150C attenuates the common-mode noise by about 19 dB at about 5.8 GHz. Thus, the more compact exemplary via-less common-mode filter 150C provides a similar common-mode insertion loss to the exemplary via-less common-mode filter 150A (e.g., a somewhat deeper notch at a somewhat higher frequency). And, as explained above, by changing the dimensions of the exemplary via-less common-mode filters 150A, 150C, the frequency, depth, and bandwidth of the notches they provide can be adjusted. For example, the width 152, length 153, gap 154, and widths 155 of the first and second sections 151A, 151B can be adjusted to adjust the frequency of the notch provided by each of the filters. Accordingly, the dimensions of the exemplary via-less common-mode filter 150C can be adjusted to provide a notch at 5.5 GHz, if desired, or at other frequencies at which common-mode noise is expected. And, as explained further below, by using more complicated filter structures (e.g., by concatenating more than two sections in series), other aspects of the insertion loss (e.g., the notch width) can be adjusted.

Figure 4D:
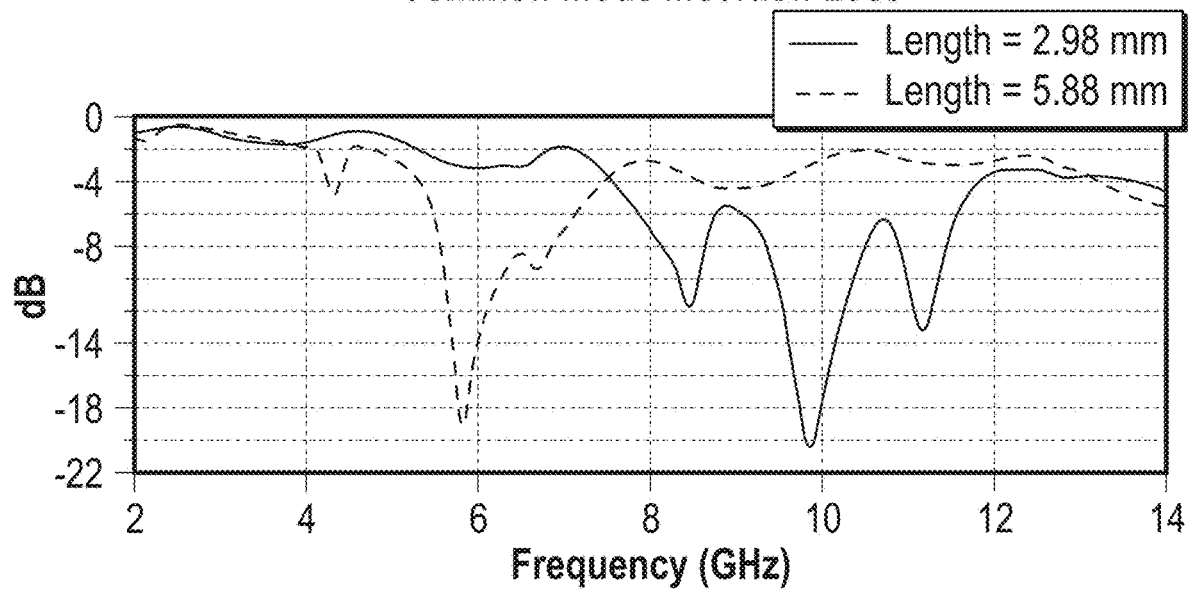
FIG. 4D is an example plot showing the effect of the via-less common-mode filter length on the common-mode insertion loss.

FIG. 4D is an example plot to show the effect of the filter length 153 on the common-mode insertion loss. FIG. 4D compares the common-mode insertion loss of the exemplary rectangular-shaped via-less common-mode filter 150C when the length 153 is 5.88 mm (dashed line) to the common-mode insertion loss of the via-less common-mode filter 150C when the length 153 is 2.98 mm (solid line). In both cases, the width 152 is 1.406 mm, the gap 154 is 0.2 mm, and the etch widths 155 are 0.2 mm. As FIG. 4D shows, reducing the length 153 of the via-less common-mode filter 150C increases the depth of the deepest notch (e.g., from about 19 dB to a little over 20 dB) and increases the frequency of the deepest notch (e.g., from about 5.83 GHz to about 9.85 GHz). In addition, when the length 153 of the exemplary via-less common-mode filter 150C is 2.98 mm, the common-mode insertion loss has additional, shallower notches of about 12 dB at about 8.4 GHz and about 13.5 dB at about 11.1 GHz. Thus, FIG. 4D illustrates that the length 153 of the via-less common-mode filter 150C can be selected to provide notching at one or more frequencies, where the notch frequency is roughly inversely proportional to the length 153. The other dimensions of the via-less common-mode filter 150C (e.g., the width 152, the gap 154, the etch width 155) also contribute to the common-mode insertion loss characteristics, but generally the length 153 has the greatest impact.

Although not illustrated herein, it is to be recognized that the via-less common-mode filters 150A and 150B, whether single-sided, partially shielded, or fully shielded, behave similarly to the via-less common-mode filter 150C. Specifically, by changing the dimensions of the via-less common-mode filters 150A, 150B (e.g., the length 153, width 152, gap 154, and etch width 155), the depths and frequencies of notches in the common-mode insertion loss can be adjusted or tuned.

As mentioned previously, more complicated via-less common-mode filters can be configured by concatenating multiple copies of the first and/or second sections 151A, 151B. For example, FIG. 5A illustrates an exemplary via-less common-mode filter 150D that includes three sections, 151A, 151B, and 151C. The sections 151A and 151B are similar or identical to the sections 151A and 151B of the exemplary via-less common-mode filter 150C previously illustrated and discussed in the context of FIGS. 4A and 4B. In the exemplary via-less common-mode filter 150D of FIG. 5A, the section 151C is substantially identical to the section 151B (e.g., it has a substantially identical shape, and each of its dimensions is substantially the same as the corresponding dimension of the section 151B). In other words, at least one dimension of section 151C is substantially identical to a corresponding dimension of section 151B. In other embodiments, the section 151C may differ in some way from the section 151B (e.g., its etch width 155 or another dimension or multiple dimensions may be different between sections 151B and 151C). The sections 151A and 151B are separated by a gap 154A, and the sections 151B and 151C are separated by a gap 154B. The gaps 154A and 154B may be the same, or they may be different.

FIG. 5B illustrates an exemplary via-less common-mode filter 150E that includes four sections, 151A, 151B, 151C, and 151D. The section 151A is similar or identical to the section 151A of the exemplary via-less common-mode filter 150C previously illustrated and discussed in the context of FIGS. 4A and 4B, and sections 151B, 151C, and 151D are similar or identical to the section 151B of the exemplary via-less common-mode filter 150C. In the exemplary via-less common-mode filter 150E of FIG. 5B, the sections 151B, 151C, and 151D are identical to each other. In other embodiments, two or more of sections 151B, 151C, and 151D may differ from each other in some way (e.g., etch width 155 or other dimensions). The sections 151A and 151B are separated by a gap 154A, the sections 151B and 151C are separated by a gap 154B, and the sections 151C and 151D are separated by a gap 154C. The gaps 154A, 154B, and 154C may be the same, or two or more of them may be different.

Figure 5C:
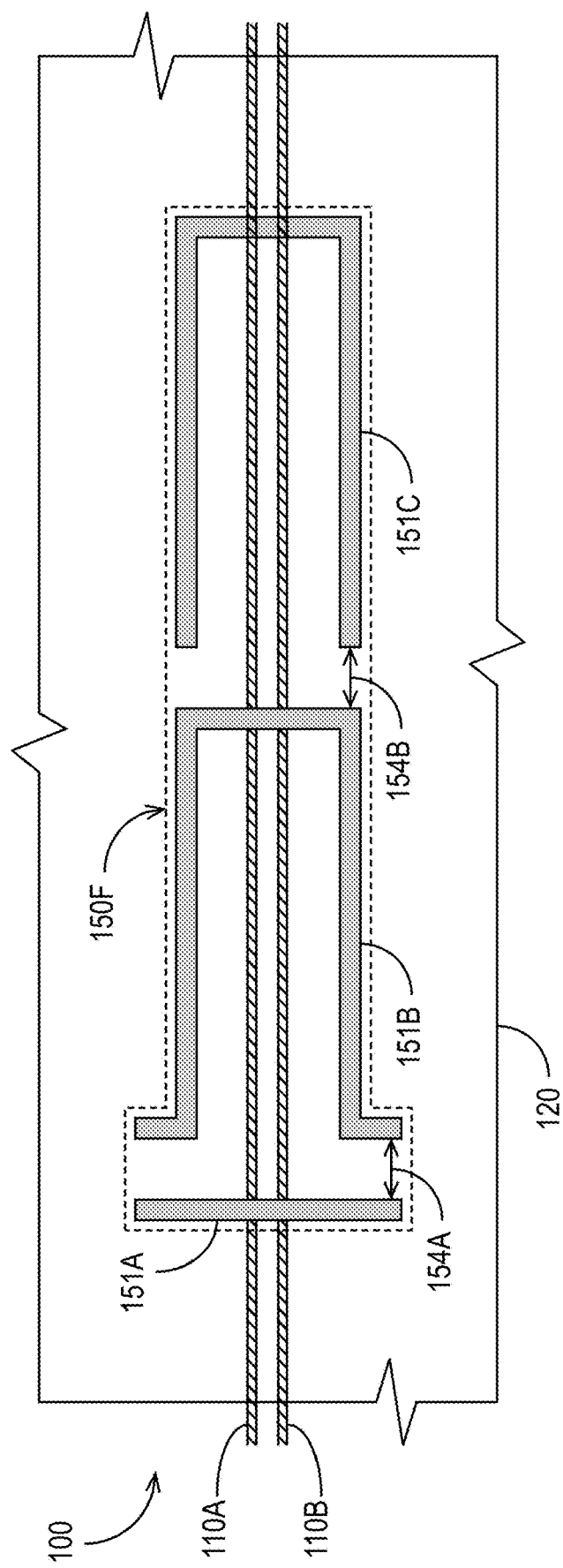
FIG. 5C illustrates another exemplary via-less common-mode filter that has a concatenated structure in accordance with some embodiments.

It is to be appreciated that a wide variety of via-less common-mode filters may be formed, including by mixing elements of the exemplary via-less common-mode filters 150A/B and 150C. For example, FIG. 5C illustrates an exemplary via-less common-mode filter 150F that combines elements of the via-less common-mode filters 150A/B and 150C in a concatenated structure. The section 151A is a linear segment, the section 151B is an omega-shaped segment (e.g., as in the exemplary via-less common-mode filters 150A and 150B), and the section 151C is a U-shaped segment (e.g., as in the exemplary via-less common-mode filter 150C).

Figure 5D:
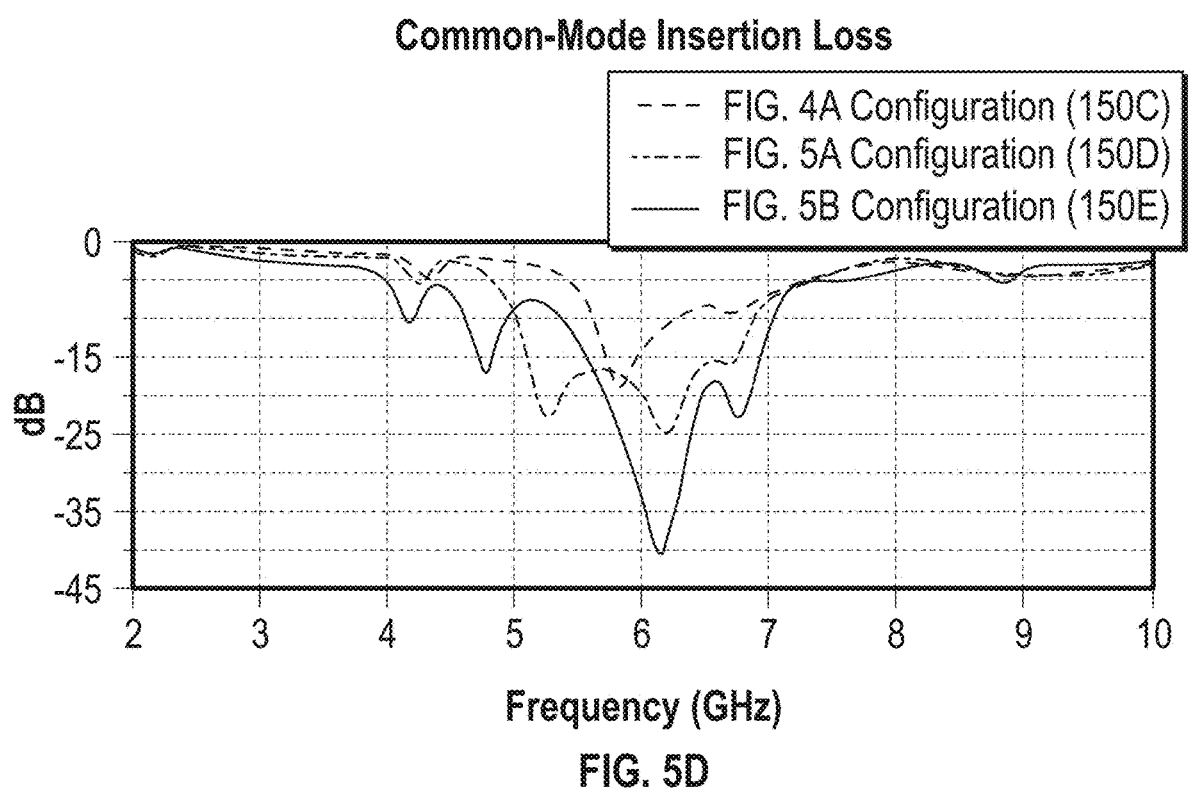
FIG. 5D plots the common-mode insertion loss of three exemplary partially-shielded via-less common-mode filters.

To illustrate the effect of concatenating multiple sections in a via-less common-mode filter, FIG. 5D plots the common-mode insertion loss of three partially-shielded via-less common-mode filters 150C, 150D, and 150E. As the plot indicates, adding sections (e.g., 151C in FIG. 5A, 151C and 151D in FIG. 5B, etc.) generally increases the notch depth, and it also increases the bandwidth in which common-mode noise is suppressed. For example, the via-less common-mode filter 150D provides two notches, one of about 23 dB at about 5.25 GHz and one of about 25 dB at about 6.2 GHz. Between those frequencies, the attenuation is more than 15 dB. Thus, relative to the via-less common-mode filter 150C, the notches are deeper. The via-less common-mode filter 150D, which has three U-shaped sections 151B, 151C, and 151D, provides a deep notch of about 40 dB at about 6.1 GHz. It also provides shallower notches of about 23 dB at about 6.8 GHz and about 17 dB at about 4.75 GHz. Thus, FIG. 5D illustrates that a wide variety of filtering characteristics can be achieved by concatenating multiple sections 151A, 151B, etc. and/or by tuning the dimensions of those sections (e.g., width 152, length 153, gap 154, and/or etch width 155). Again, it is to be understood that although FIGS. 5A and 5B illustrate via-less common-mode filters in which at least two sections are identical, there is no requirement for any two sections to be the same in a concatenated filter structure.

Figure 6A:
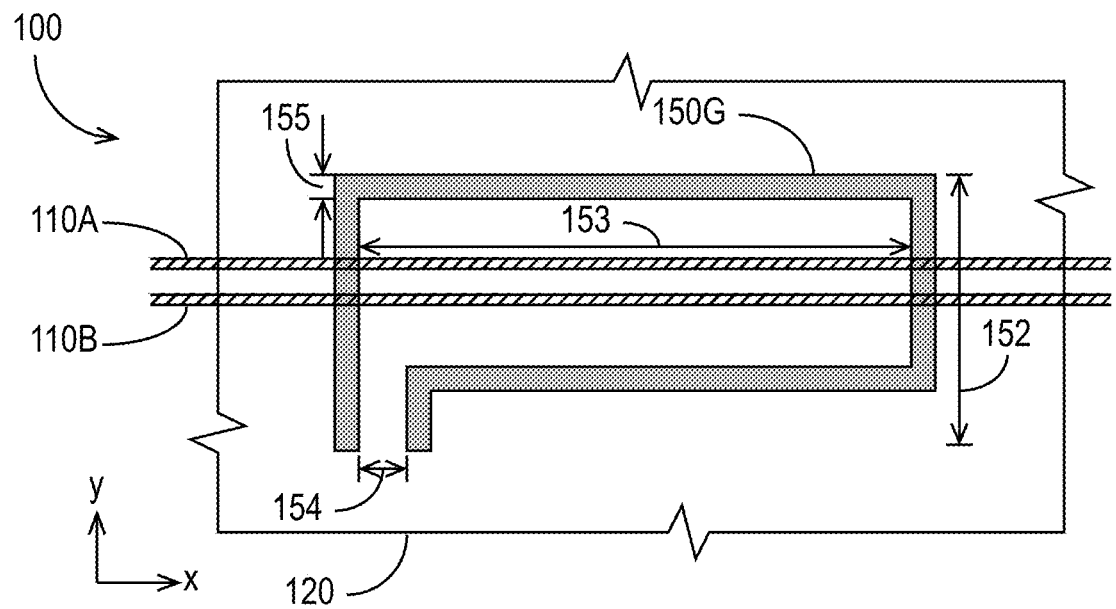
FIG. 6A is a top view of a PCB that includes another exemplary via-less common-mode filter in accordance with some embodiments.

FIGS. 2A-2D, 3A-3F, 4A, 4B, and 5A-5C all illustrate via-less common-mode filters that include multiple sections 151A, 151B, etc. It is to be appreciated that, in other embodiments, a via-less common-mode filter includes only one contiguous section (e.g., etched into a reference plane 120). FIG. 6A is a top view of a PCB 100 that includes one such exemplary via-less common-mode filter 150G in accordance with some embodiments. As shown, the via-less common-mode filter 150G is formed by a single, contiguous, piece-wise linear L-shaped segment. The via-less common-mode filter 150G has various dimensions as previously described. For example, the via-less common-mode filter 150F has a width 152 and a length 153, each of which may be any suitable value. The width 152 of the via-less common mode filter 150F may be for example, between approximately 1 mm and approximately 3 mm. The length 153 may be between approximately 2 mm and approximately 7 mm, for example. The exemplary via-less common-mode filter 150F also includes a gap 154 between the ends of the section. The gap 154 may be any suitable value (e.g., greater than zero and less than about 0.5 mm). The etch width 155 of the via-less common-mode filter 150F may be any suitable value. For example, the width 155 may be greater than zero and less than approximately 0.5 mm.

Figure 6B:
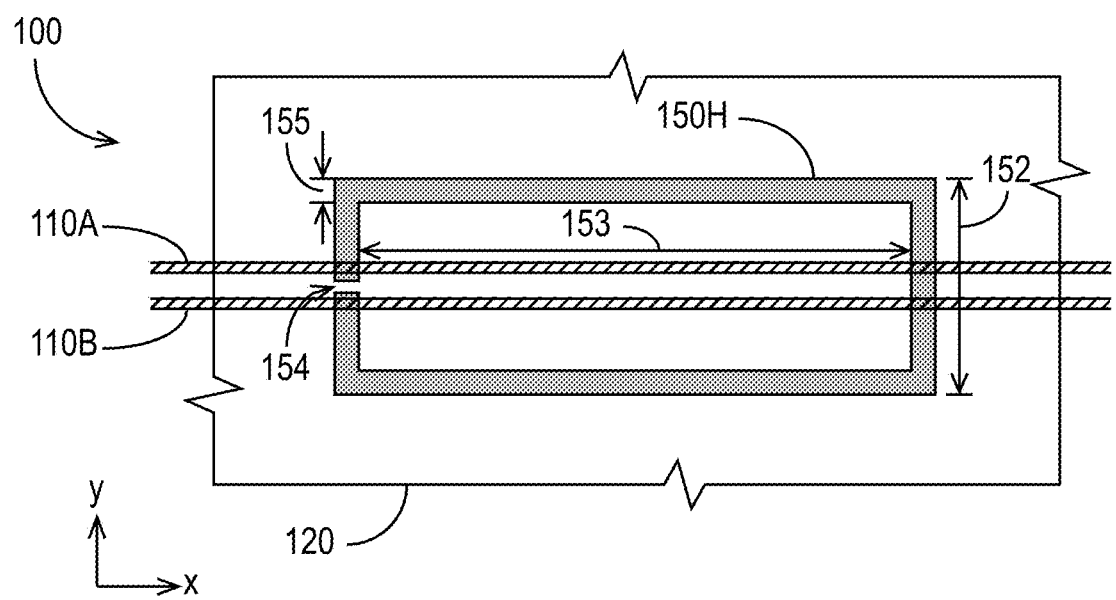
FIG. 6B is a top view of a PCB that includes another exemplary via-less common-mode filter in accordance with some embodiments.

FIG. 6B is a top view of a PCB 100 that includes another exemplary via-less common-mode filter 150H in accordance with some embodiments. As shown, like the via-less common-mode filter 150G described above, the via-less common-mode filter 150H is formed by a single, contiguous, piece-wise linear rectangular-shaped segment (which may be, for example, etched in the reference plane 120). The via-less common-mode filter 150H has various dimensions as previously described. For example, the via-less common-mode filter 150G has a width 152 and a length 153, each of which may be any suitable value. The width 152 of the via-less common mode filter 150H may be for example, between approximately 1 mm and approximately 2 mm. The length 153 may be between approximately 2 mm and approximately 7 mm, for example. The exemplary via-less common-mode filter 150H also includes a gap 154 between the ends of the section. In the exemplary via-less common-mode filter 150H shown in FIG. 6B, the gap 154 resides between and equidistant from each of the two signal traces 110A and 110B. The gap 154 may be any suitable value (e.g., greater than zero and less than about 0.5 mm). The etch width 155 of the via-less common-mode filter 150H may be any suitable value. For example, the width 155 may be greater than zero and less than approximately 0.5 mm.

The exemplary via-less common-mode filters 150G and 150H may be single-sided, or they may be partially shielded or fully shielded as described in the context of FIGS. 3A-3F.

Figure 6C:
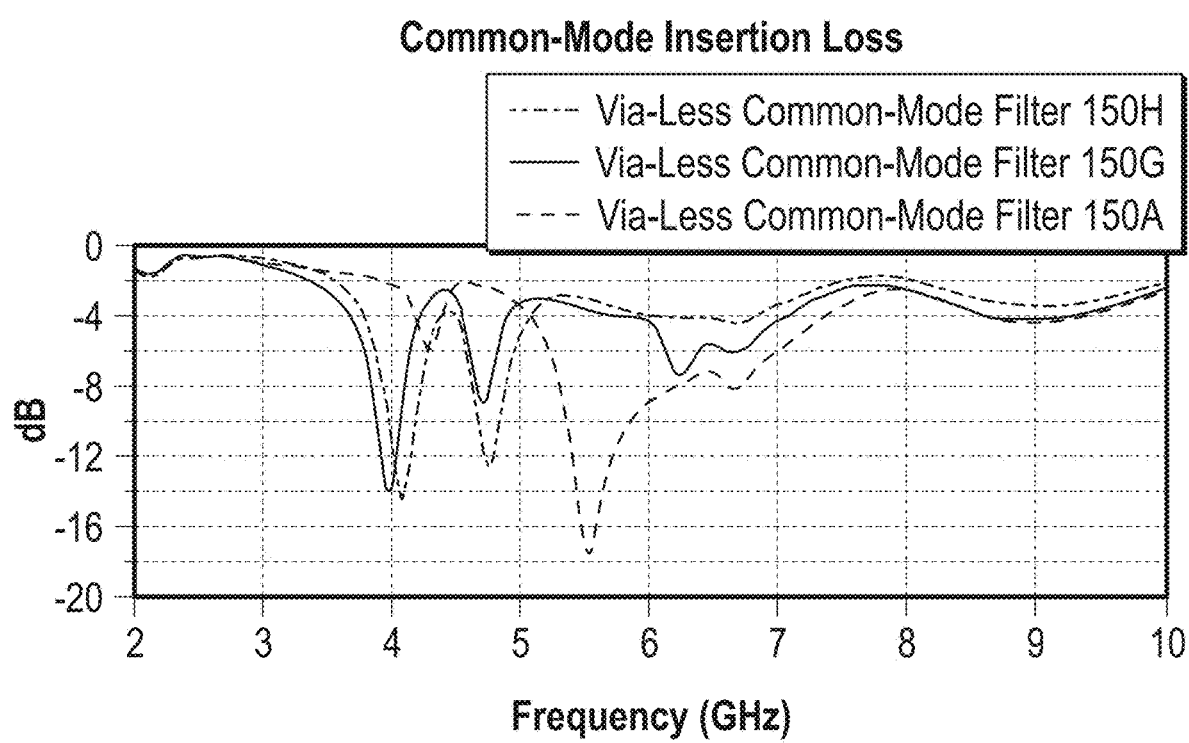
FIG. 6C compares the common-mode insertion losses of various exemplary via-less common-mode filters.

FIG. 6C compares the common-mode insertion losses of the exemplary via-less common-mode filters 150A, 150G, and 150H, all partially shielded. As shown, the via-less common-mode filter 150G provides an approximately 14 dB notch at a frequency slightly below 4 GHz and a shallower notch of approximately 9 dB at about 4.7 GHz. The via-less common-mode filter 150H provides a notch of a little more than 14 dB at about 4.1 GHz and a second notch of about 12.5 dB at about 4.75 GHz. As described previously and shown again in FIG. 6C, the via-less common-mode filter 150A provides a notch of a little less than 18 dB at about 5.5 GHz. It is to be appreciated that, as explained above, the locations of the notches in the insertion losses of the exemplary via-less common-mode filters 150G and 150H may be adjusted to provide a wide variety of filtering characteristics by adjusting the dimensions of the segment (e.g., width 152, length 153, gap 154, and/or etch width 155). The length 153 in particular can be adjusted so that the via-less common-mode filter 150G or 150H suppresses common-mode noise at a frequency at which common-mode noise is expected.

It is also to be appreciated that all of the via-less common-mode filters 150A, 150B, 150C, 150D, 150E, 150F, 150G, and 150H disclosed herein may be single-sided, or they may be partially shielded or fully shielded as described in the context of FIGS. 3A-3F.

Figure 7:
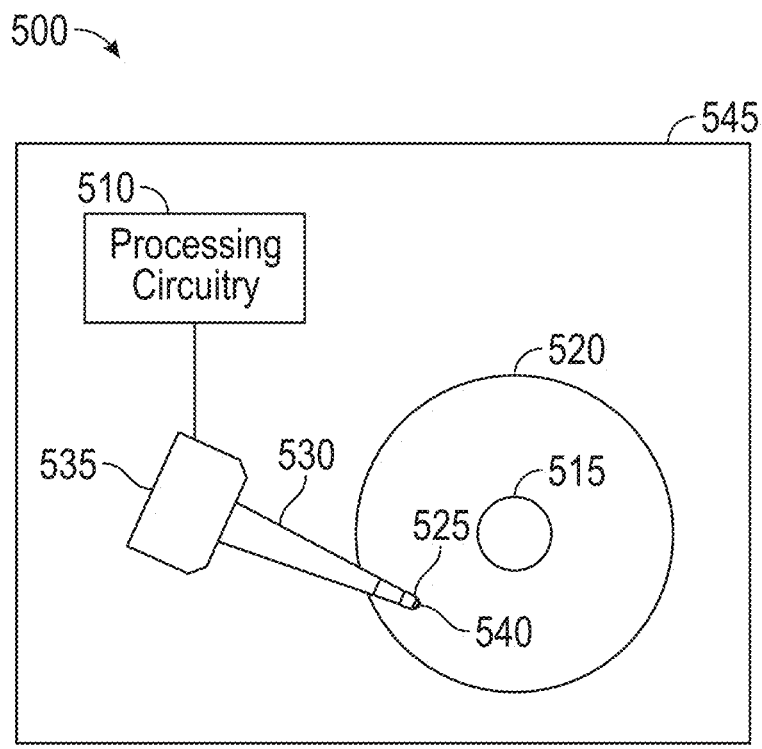
FIG. 7 illustrates several components of an exemplary data storage device in accordance with some embodiments.

FIG. 7 illustrates several components of an exemplary data storage device, namely, a hard disk drive 500, that may include some embodiments of the via-less common-mode filters disclosed and described herein. The hard disk drive 500 includes a spindle 515 that supports and rotates a magnetic disk 520. The spindle 515 is rotated by a spindle motor (not shown) that is controlled by a motor controller (not shown) that may be implemented in electronics of the hard disk drive 500. A slider 525, which is supported by a suspension and actuator arm 530, includes a combined read and write magnetic head 540. An actuator 535 rotatably positions the suspension and actuator arm 530 over the magnetic disk 520. The components of the hard disk drive 500 may be mounted on a housing 545. It is to be understood that although FIG. 7 illustrates a single disk 520, a single slider 525, a single head 540, and a single suspension and actuator arm 530, hard disk drive 500 may include a plurality (i.e., more than one) of disks 520, sliders 525, heads 540, and suspension and actuator arms 530.

The slider 525 has a gas-bearing surface that faces the surface of the disk 520 and counteracts a preload bias that pushes the slider toward the disk 520. For convenience, in this document the gas-bearing surface is referred to as the air-bearing surface (ABS) and the gas is generally referred to as "air," although it is to be understood that the gas used in a hard disk drive 500 may be a gas other than air (e.g., the gas may be helium). For simplicity, throughout this disclosure, the surface of the slider 525 that faces or that will eventually face the disk 520 is referred to as the ABS.

As the disk 520 rotates, the disk 520 drags air under the slider 525 and along the ABS in a direction approximately parallel to the tangential velocity of the disk 520. As the air passes under the ABS, air compression along the air flow path causes the air pressure between the disk 520 and the ABS to increase, which creates a hydrodynamic lifting force that counteracts the tendency of the suspension and actuator arm 530 to push the slider 525 toward the disk 520. The slider 525 thus flies above the disk 520 but in close proximity to the surface of the disk 520.

In operation, the actuator 535 moves the suspension and actuator arm 530 to position the slider 525 so that the magnetic head 540 is in a transducing relationship with the surface of the magnetic disk 520. The head 540 may be used to write information to one or more tracks on the surface of the disk 520 and to read previously-recorded information from the tracks on the surface of the disk 520. Processing circuitry 510 provides to the head 540 signals representing information to be written to the disk 520 and receives from the head 540 signals representing information read from the disk 520. The processing circuitry 510 also provides signals to the spindle motor to rotate the magnetic disk 520, and to the actuator 535 to move the slider 525 to various tracks.

For writing, the head 540 may use a single pole writer that has a main pole surrounded by magnetic shield materials. The main pole is typically separated from the magnetic shield materials by a non-magnetic spacer. The main pole may have a tapered shape with a tip that faces the magnetic recording media and is part of the ABS. The single pole writer may include a conductive coil encircling the writer pole in a helical or pancake like configuration.

To write to the disk 520, the slider 525 passes over a region of the disk 520, and an electric current is applied through the coil of the head 540, which causes a large magnetic field to be generated from the main pole tip. The polarity of the generated field causes a region of the magnetic disk 520 to assume a polarity, thus enabling information to be stored on the disk 520.

To read information from the disk 520, the head 540 may include only one read sensor, or it may include multiple read sensors. The read sensor(s) in the head 540 may include, for example, one or more giant magnetoresistance (GMR) sensors, tunneling magnetoresistance (TMR) sensors, or another type of magnetoresistive sensor. When the slider 525 passes over a region of the disk 520, the head 540 detects changes in resistance due to magnetic field variations recorded on the disk 520, which represent the recorded bits.

Figure 8:
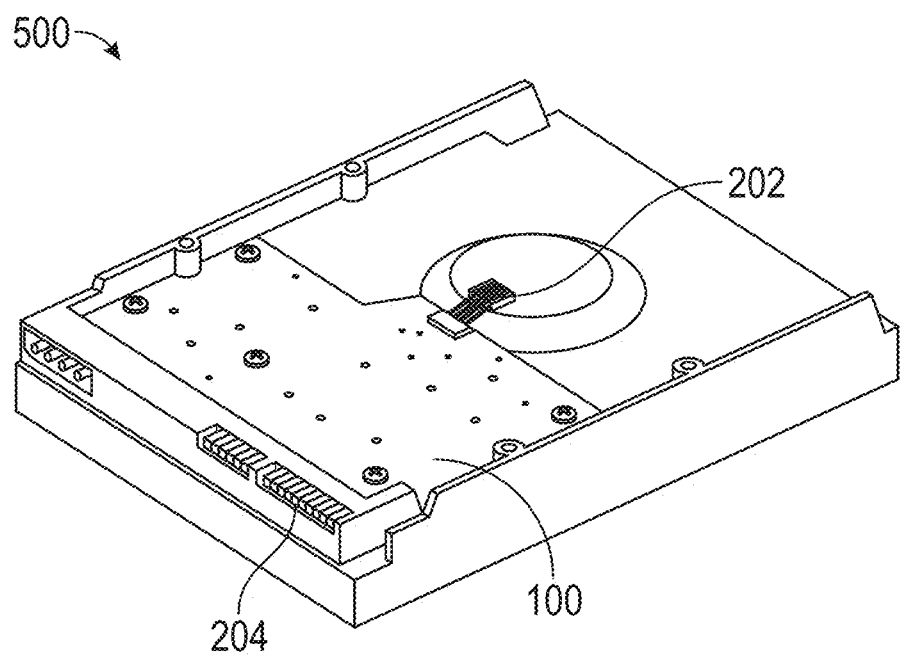
FIG. 8 is a schematic bottom illustration of an exemplary data storage device that includes a printed circuit board comprising a via-less common-mode filter in accordance with some embodiments.

FIG. 8 is a schematic bottom illustration of a hard disk drive 500 including a PCB 100 that may include any of the embodiments disclosed herein to reduce common-mode noise. The PCB 100 has electrical connections 202 to other components of the hard disk drive 500 and electrical connections 204 to be used to connect the hard disk drive 500 to a device (e.g., a computer) that will use the hard disk drive 500.

Hard disk drives such as disk drive 500 may utilize serial interface input/output electrical lines, which may vary depending on the interfaces used, and in a particular example, the serial attached small (SAS) computer-system interface may inherently generate common-mode noise at frequencies that are multiples of 6 GHz, i.e., 6 GHz, 12 GHz, 18 GHz, and 24 GHz at SAS trace. As explained above, prior-art solutions to filter out such common-mode noise suffer from various deficiencies, such as not providing sufficient notch depths at the affected frequencies, or being too large or too numerous to fit on the surface of a PCB 100. As will be appreciated, the embodiments disclosed herein address many or all of the deficiencies of prior art approaches. Whereas a hard disk drive is shown as an example, the various embodiments can be applicable to the PCBs of other data storage devices such as solid state drives (SSD), magnetic tape drives, and the like, and, more generally, to the PCBs of electronic devices where such common-mode noise filtering is needed or desirable.

Used by themselves, the various via-less common-mode filters (e.g., 150A through 150H) disclosed herein provide substantial attenuation of common-mode noise in (or caused by the circuits of) PCBs 100. By modifying the via-less common-mode filter structure (e.g., number and configuration of sections) and dimensions (e.g., width 152, length 153, gap 154, etch width 155) as explained herein, the frequency response of the filter can be adjusted without the need for surface components (e.g., capacitors or inductors) on the PCB 100. It is to be understood, however, that surface components may be used in conjunction with the filters disclosed herein to further adjust the filter characteristics.

The figures herein illustrate two signal traces 110A, 110B, which may be, for example, differential signal traces or single-ended signal traces, or a combination of the two. It is to be understood that the PCB 100 may include more or fewer than two signal traces, and these signal traces may be filtered by the common-mode filters 150A, 150B, etc. Of course, for differential signaling, if one signal trace of a differential pair passes through the common-mode filter 150A, 150B, etc., the other signal trace of that differential pair should also pass through the same common-mode filter 150A, 150B, etc. to maintain the desirable properties of differential signaling described previously.

Figure 9:
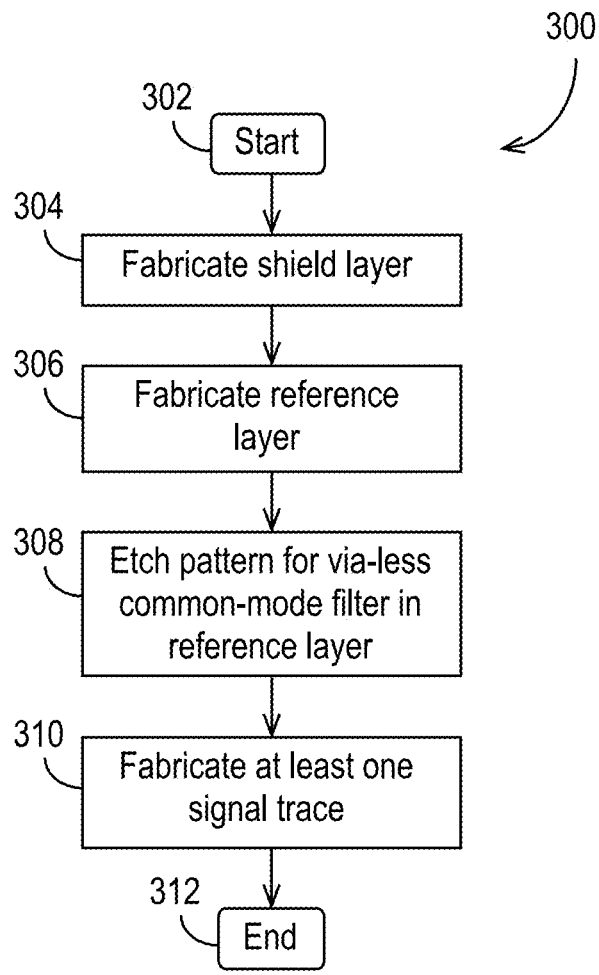
FIG. 9 is a flow diagram illustrating steps of an exemplary method of manufacturing a multi-layer metal circuit, such as a PCB, comprising a via-less common-mode filter in accordance with some embodiments.

FIG. 9 is a flow diagram illustrating a method 300 of manufacturing a PCB or other multi-layer metal circuit comprising a via-less common-mode filter. At 302, the method begins. At 304, a shield layer (e.g., 130) is fabricated. At 306, a reference layer (e.g., 120) is fabricated. At 308, a pattern of the via-less common-mode filter is created in the reference layer, for example, by etching. At 310, at least one signal trace (e.g., 110A/B) is fabricated over the pattern in the reference layer. At 312, the method ends.

It is to be appreciated that the steps of the method 300 can be reordered. For example, step 310 can be performed before steps 304, 306, and 308, and steps 306 and 308 can be performed before step 304. In other words, the at least one signal trace can be fabricated, then a reference layer (into which the pattern is created), and then a shield layer.

It is also to be appreciated that the steps of the method 300 can be used to create either a single-sided, partially-shielded, or fully-shielded via-less common-mode filter. For example, after completing step 310, steps 306 and 308 can be repeated, followed by step 304, to create a fully-shielded implementation of a via-less common-mode filter.

It is also to be appreciated that, as explained above, although the disclosures herein are in the context of a PCB, the disclosed via-less common-mode filters 150A, 150B, etc. are suitable for use in any multi-layer metal circuit, such as, for example, an integrated circuit. The description herein in the context of PCBs is merely for convenience and is not meant to be limiting.

In the foregoing description and in the accompanying drawings, specific terminology has been set forth to provide a thorough understanding of the disclosed embodiments. In some instances, the terminology or drawings may imply specific details that are not required to practice the invention.

Although this document explains aspects of certain embodiments in the context of data storage devices, using hard disk drives as examples of data storage devices, the disclosures herein are not limited to use in data storage device applications. Specifically, the various embodiments are applicable to other electronic devices with noise/interference mitigation needs. Furthermore, although certain embodiments are explained in the context of hard disk drives, and some of the drawings show a hard disk drive as an example data storage device, the various embodiments are applicable to other data storage devices such as solid state drives, solid state hybrid disk drives, optical disk drives, tape drives, and the like.

To avoid obscuring the present disclosure unnecessarily, well-known components (e.g., of a disk drive, of a PCB, etc.) are shown in block diagram form and/or are not discussed in detail or, in some cases, at all.

Unless otherwise specifically defined herein, all terms are to be given their broadest possible interpretation, including meanings implied from the specification and drawings and meanings understood by those skilled in the art and/or as defined in dictionaries, treatises, etc. As set forth explicitly herein, some terms may not comport with their ordinary or customary meanings.

As used in the specification and the appended claims, the singular forms "a," "an" and "the" do not exclude plural referents unless otherwise specified. The word "or" is to be interpreted as inclusive unless otherwise specified. Thus, the phrase "A or B" is to be interpreted as meaning all of the following: "both A and B," "A but not B," and "B but not A." Any use of "and/or" herein does not mean that the word "or" alone connotes exclusivity.

As used herein, phrases of the form "at least one of A, B, and C," "at least one of A, B, or C," "one or more of A, B, or C," and "one or more of A, B, and C" are interchangeable, and each encompasses all of the following meanings: "A only," "B only," "C only," "A and B but not C," "A and C but not B," "B and C but not A," and "all of A, B, and C."

To the extent that the terms "include(s)," "having," "has," "with," and variants thereof are used in the detailed description or the claims, such terms are intended to be inclusive in a manner similar to the term "comprising," i.e., meaning "including but not limited to."

The terms "exemplary" and "embodiment" are used to express examples, not preferences or requirements.

The term "coupled" is used herein to express a direct connection/attachment as well as a connection/attachment through one or more intervening elements or structures.

The terms "over," "under," "between," and "on" are used herein refer to a relative position of one feature with respect to other features. For example, one feature disposed "over" or "under" another feature may be directly in contact with the other feature or may have intervening material. Moreover, one feature disposed "between" two features may be directly in contact with the two features or may have one or more intervening features or materials. In contrast, a first feature "on" a second feature is in contact with that second feature.

The term "substantially" is used to describe a structure, configuration, dimension, etc. that is largely or nearly as stated, but, due to manufacturing tolerances and the like, may in practice result in a situation in which the structure, configuration, dimension, etc. or a relationship between the structure, configuration, dimension, etc. and a reference is not always or necessarily precisely as stated. For example, describing two lengths as "substantially equal" means that the two lengths are the same for all practical purposes (e.g., whatever difference there may be is unimportant or insignificant), but they may not (and need not) be precisely equal at sufficiently small scales. As another example, a structure that is "substantially vertical" would be considered to be vertical for all practical purposes, even if it is not precisely at 90 degrees relative to horizontal.

The drawings are not necessarily to scale, and the dimensions, shapes, and sizes of the features may differ substantially from how they are depicted in the drawings.

Although specific embodiments have been disclosed, it will be evident that various modifications and changes may be made thereto without departing from the broader spirit and scope of the disclosure. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

What is claimed is:

1. A multi-layer metal circuit, comprising:
   a shield layer;
   a signal trace layer comprising at least one signal trace; and
   a ground layer disposed between the shield layer and the signal trace layer, the ground layer comprising a pattern of a via-less common-mode filter.

2. The multi-layer metal circuit recited in claim 1, wherein the pattern comprises a first section and a second section, the first and second sections being disjoint and non-intersecting.

3. The multi-layer metal circuit recited in claim 2, wherein:
   the first section is a linear segment and the second section is (a) an omega-shaped segment or (b) a U-shaped segment.

4. The multi-layer metal circuit recited in claim 2, wherein the pattern has a T-shape.

5. The multi-layer metal circuit recited in claim 4, wherein a length of the via-less common-mode filter is between approximately 2 mm and approximately 7 mm.

6. The multi-layer metal circuit recited in claim 4, wherein a length of the via-less common-mode filter is between approximately 2.5 mm and approximately 3.5 mm, and a width of the via-less common-mode filter is between approximately 1 mm and approximately 2 mm.

7. The multi-layer metal circuit recited in claim 2, wherein the pattern further comprises a third section, wherein at least one dimension of the third section is substantially identical to a corresponding dimension of the second section.

8. The multi-layer metal circuit recited in claim 2, wherein the pattern further comprises a third section, wherein a shape of the third section is substantially identical to a shape of the second section.

9. The multi-layer metal circuit recited in claim 8, wherein the first section is linear, and the second and third sections are U-shaped.

10. The multi-layer metal circuit recited in claim 1, wherein the pattern has an L-shape or a rectangular shape.

11. The multi-layer metal circuit recited in claim 1, wherein the shield layer is a first shield layer, the ground layer is a first ground layer and is disposed on a first side of the signal layer, and further comprising:
    a second shield layer; and
    a second ground layer disposed between the second shield layer and a second side of the signal trace layer, the second ground layer comprising a mirror image of the pattern.

12. A data storage device comprising the multi-layer metal circuit recited in claim 1.

13. A method of manufacturing the multi-layer metal circuit recited in claim 1, the method comprising etching the pattern into the ground layer.

14. A printed circuit board, comprising:
    a shield layer;
    at least one signal trace;
    a reference layer disposed between the shield layer and the at least one signal trace; and
    a common-mode filter etched into the reference layer,
    wherein the common-mode filter is electrically isolated from the shield layer.

15. The printed circuit board recited in claim 14, wherein the common-mode filter comprises a plurality of segments.

16. The printed circuit board recited in claim 15, wherein the plurality of segments comprises at least one piece-wise linear segment.

17. The printed circuit board recited in claim 16, wherein the plurality of segments further comprises at least one linear segment.

18. The printed circuit board recited in claim 15, wherein the plurality of segments comprises a first segment and a second segment, wherein the first and second segments are substantially identical.

19. The printed circuit board recited in claim 15, wherein the plurality of segments comprises a first segment and a second segment, wherein at least one dimension of the first segment differs from a corresponding dimension of the second segment.

20. The printed circuit board recited in claim 14, wherein the common-mode filter comprises at least one piece-wise linear segment.

21. A data storage device comprising the printed circuit board recited in claim 14.

22. A method of manufacturing the printed circuit board recited in claim 14, the method comprising:
    fabricating the shield layer;
    fabricating the reference layer;
    etching the common-mode filter into the reference layer; and
    fabricating the at least one signal trace.

* * * * *